(12) United States Patent
Yamazaki et al.

(10) Patent No.: US 7,148,502 B2
(45) Date of Patent: Dec. 12, 2006

(54) LIGHT EMITTING DEVICE, ELECTRONIC EQUIPMENT AND APPARATUS FOR MANUFACTURING THE SAME

(75) Inventors: Shunpei Yamazaki, Tokyo (JP); Hiroko Abe, Tokyo (JP); Masakazu Murakami, Kanagawa (JP); Ryoji Nomura, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 10/814,159

(22) Filed: Apr. 1, 2004

(65) Prior Publication Data
US 2004/0195965 A1    Oct. 7, 2004

(30) Foreign Application Priority Data
Apr. 2, 2003    (JP)    ............... 2003-099650

(51) Int. Cl.
*H01L 35/24* (2006.01)
(52) U.S. Cl. .......................... 257/40; 438/99
(58) Field of Classification Search ................ 257/40
See application file for complete search history.

(56) References Cited

U.S. PATENT DOCUMENTS 6,590,346 B1 *   7/2003   Hadley et al. ............ 315/169.3
6,737,800 B1 *   5/2004   Winters et al. ............. 313/504

FOREIGN PATENT DOCUMENTS

JP    3408154    3/2003
JP    3408154    5/2003

OTHER PUBLICATIONS

Exhibition of Active Matrix Type Organic EL Display at "13th Flat Panel Display Manufacturing Technology Expo & Conference" by ELDis Group (*in Japanese with full translation*); Jul. 2, 2003.
Documents distributed in the "13th Flat Panel Display Manufacturing Technology Expo & Conference" by ELDis Group (5 pages).
"Two-way display developed"; *The Japan Times*; (1 page); Jul. 3, 2003.
"Mass Production of Organic EL Devices"; *Shimotsuke Newspaper* (*in Japanese with full translation*); Jul. 3, 2003.
Brian W. D'Andrade et al., "White Light Emission Using Triplet Excimers in Electrophosphorescent Organic Light-Emitting Devices", Advanced Materials, vol. 14, No. 15, Aug. 5, 2002, pp. 1032-1036.

* cited by examiner

*Primary Examiner*—Wai-Sing Louie
(74) *Attorney, Agent, or Firm*—Fish & Richardson P.C.

(57) ABSTRACT

To provide an aspect of a novel display device using a light emitting element which is composed of a cathode, an EL layer and an anode, and a manufacturing device of the display device. According to the present invention, dual-sided emission display can be performed in one sheet white color light emitting panel 1001 in which, for example, different images can be displayed on a topside screen and backside screen (full color display, monochrome display or area color display). Two polarizing plates 1002, 1003 are formed by shifting the position thereof with an angular deviation of 90 degrees each other so as to prevent outside light from passing through the pane, thereby realizing a black display when not displayed.

15 Claims, 10 Drawing Sheets white color light emission white color light emission

Fig. 7A
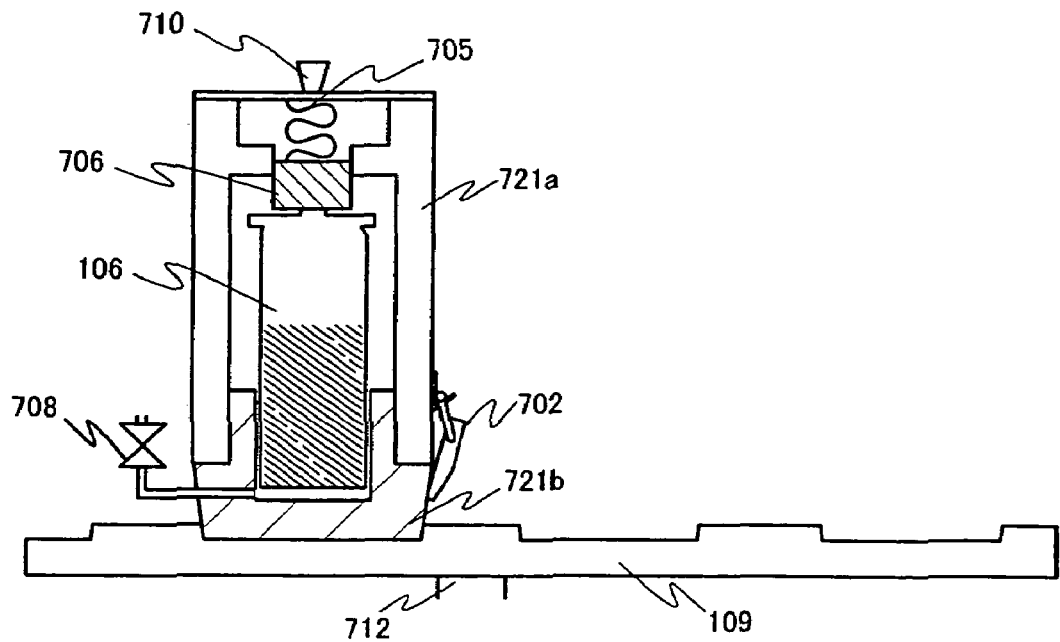
Fig. 7B
Fig. 7C
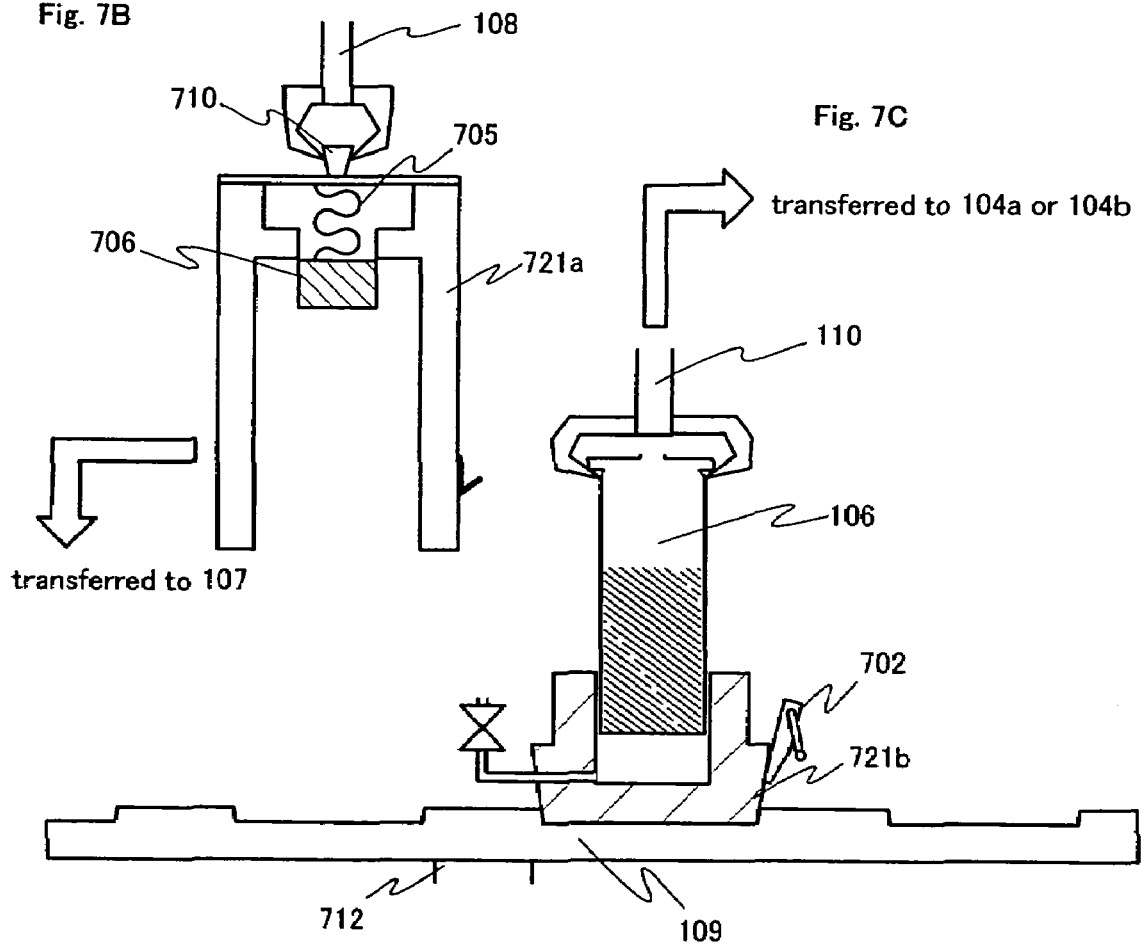
transferred to 104a or 104b
transferred to 107

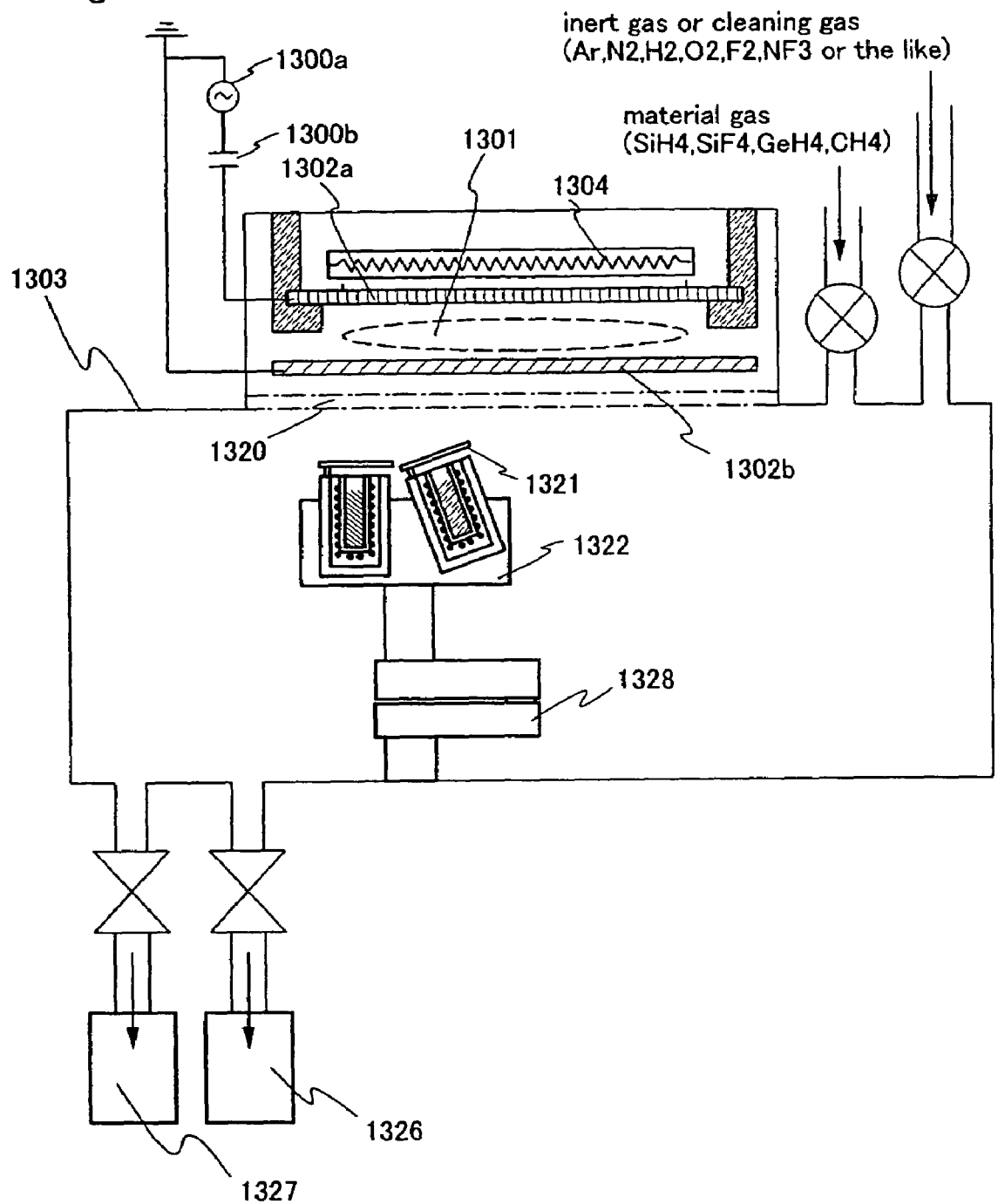

LIGHT EMITTING DEVICE, ELECTRONIC EQUIPMENT AND APPARATUS FOR MANUFACTURING THE SAME

BACKGROUND OF THE INVENTION

1. Field of the Invention

The present invention relates to a light emitting device including a light emitting element in which phosphorescence or fluorescence can be obtained by applying an electric field to an element provided with a film containing an organic compound (hereinafter referred to as an "organic compound layer") between a pair of electrodes. The present invention further relates to a method of manufacturing thereof. In this specification, the light emitting device indicates an image display device, a light emitting device, or a light source (including a lighting equipment). In addition, examples of the light emitting device also include a module with a connector such as a flexible printed circuit (FPC), a tape automated bonding (TAB) tape, and a tape carrier package (TCP) attached to a light emitting device, a module with a printed circuit board provided at the end of a TAB tape or a TCP, and a module with an integrated circuit (IC) directly mounted on a light emitting element by a chip on glass (COG) method. The present invention further relates to a method of manufacturing the light emitting device.

2. Description of the Related Art

In recent years, researches on a light emitting device comprising an EL element as a self-luminous light emitting element has been activated. The light emitting device is also referred to as an organic EL display or an organic light emitting diode. The light emitting devices have characteristics such as high response speed which is suitable for displaying moving images, low voltage drive, and low power consumption drive. Therefore, the light emitting devices has recently been attracting attention as a next-generation displays including new-generation cellular phones, personal digital assistants (PDA), and the like.

The EL element includes a layer containing an organic compound in which electroluminescence can be obtained by applying electric field thereto, an anode, and a cathode. The electroluminescence in the organic compound includes light emission (fluorescence) upon returning form a singlet excited state to a ground state and light emission (phosphorescence) upon returning from the triplet excited state to the ground state. Either or both types of the luminescence can be used for the light emitting device manufactured by a film formation device and a film formation method according to the present invention.

As different from a liquid crystal display device, the light emitting device has characteristics in that they have no problem with the viewing angle because it is a self-luminous type. More specifically, the light emitting device is more suitable for displays used in outdoors than the liquid crystal display. Various forms for use have been proposed.

In this specification, the light emitting element including the cathode, an EL layer and the anode is referred to as the EL element. The EL element has two types: the system in which the EL layer is formed between two kinds of stripe electrodes disposed orthogonal to each other (simple matrix system), and the system in which the EL layer is formed between an opposite electrode and pixel electrodes connected to TFTs and arranged in matrix (active matrix system). However, when the pixel density is increased, the active matrix system in which a switch is provided for each pixel (or a dot) is considered to be advantageous because it is available for low voltage drive as compared with the simple matrix system.

Conventionally, there has been an electronic equipment in which a plurality of different panels is formed. For instance, a lap-top computer is provided with a monochromatic reflection type liquid crystal panel for displaying simple display such as a power source level, and a battery level in addition to a main display screen panel (a transmission type liquid crystal panel for full-color display).

SUMMARY OF THE INVENTION

It is an object of the present invention to provide embodiment modes of a novel display device using the light emitting element including the cathode, the EL layer, and the anode.

According to the present invention, the cathode and the anode are formed of transparent materials. A substrate and a sealing substrate are further formed of the transparent materials. With respect to the light emission emitted from a layer containing an organic compound, dual-sided emission display of light emission passing through the cathode and light emission transmitting the anode can be simultaneously displayed.

The layer including the organic compound emit white color light emission, and a color filter or a color conversion layer is formed such that one of the display screens performs full color display. The light emitting direction which has ultimately large luminance may be selected as that passing through the color filter. When an active matrix light emitting device is used, the luminance is reduced by passing through an interlayer insulating film or a protective film of a TFT. Therefore, it is preferable to form the color filter on the sealing substrate side in which the TFT is not formed.

According to the present invention, dual-sided emission display by one panel (full-color display, monochrome display, and area color display) in which, for example, different images are simultaneously displayed, can be carried out.

By emitting white color light emission from the light emitting element according to the present invention, it is possible to dispense with a high-precision metal mask used for selectively evaporating each minute region corresponding to R, G, and B, which leads to improvement of productivity. When the vapor deposition is selectively performed for R, G, and B, a large number of deposition chambers for R, G, and B are required. On the other hand, when white color light emission is used, the number of the evaporation chambers can be relatively reduced in the manufacturing device as compared with the vapor deposition for R, G, and B.

According to the present invention, two polarizing plates are provided in a panel by setting directions of the polarizing plates at right angles, preventing outside light from transmitting through the panel. As result, a black display can be realized while the display is not carried out on the panel. A circular polarizing plate used for preventing the reflection of light is formed of a special optical film and expensive. However, the polarizing plates used in this invention are versatilely used in the field of liquid crystal panels and is inexpensive.

As shown in FIG. 1A, according to one aspect of the present invention, there is provided the light emitting device, including: a pixel portion having a plurality of light emitting elements which has a transparent first electrode, a layer containing an organic compound in contact with a surface of the first electrode, and a transparent second electrode in contact with a surface of the layer containing the organic compound; and a color filter, wherein the light emitting elements simultaneously emit blue-color light, phosphorescence from an organic metal complex, and light from the organic metal complex in an excimer state so as to generate white color light emission, wherein white color light emission passing through the second electrode generates full color display through the color filter, and wherein white color light emission passing through the first electrode generates monochrome display.

As shown in FIG. 1B, according to another aspect of the present invention, there is provided the light emitting device, including: a pixel portion having a plurality of light emitting elements each of which has a transparent first electrode, a layer containing an organic compound in contact with a surface of the first electrode, and a transparent second electrode in contact with a surface of the layer containing the organic compound; a color filter; a first polarizing plate; and a second polarizing plate, wherein the light emitting elements simultaneously emit blue color light, phosphorescence from an organic metal complex, and light from the organic metal complex in an excimer state so as to generate white color light emission, wherein white color light emission passing through the second electrode generates full color display through the color filter and the first polarizing plate, and wherein white color light emission passing through the first electrode generates monochrome display through the second polarizing plate.

According to the aforementioned structures, the layer containing the organic compound is characterized by comprising: a first light emitting layer which emits blue color light; and a second light emitting layer which includes a phosphorescent material and simultaneously emits phosphorescence from the phosphorescent material and the light emission from the phosphorescent material in excimer state. Further, according to the aforementioned structures, the second light emitting layer is characterized in that a host material is mixed with the phosphorescent material at a concentration of more than 10 wt % and less than 40 wt %, more preferably at a concentration of more than 12.5 wt % and less than 20 wt %.

Generically, the host material contains less than 1 wt % of a singlet compound and 5 to 7 wt % of triplet compound. Therefore, each of the singlet compound and the triplet compound are referred to as a dopant since the concentration thereof is several wt %. According to the present invention, however, the concentration of the phosphorescent material is more than 10 wt %, and therefore the phosphorescent material is not the dopant. The concentration of the phosphorescent material is difficult to be controlled at the several wt % as the dopant. In such cases, when the amount of the phosphorescent material is minutely varied, radiation spectrum and electronic characteristics are easily changed and varied. Meanwhile, according to the present invention, since the phosphorescent material is mixed at a concentration of not less than 10 wt %, the concentration of the phosphorescent material is easily controlled, thereby a stable light emitting element can be obtained.

According to the aforementioned structures, the layer including the organic compound is further characterized by including the three layers of: the first light emitting layer which emits blue color light; the second light emitting layer which includes the host material mixed with the phosphorescent material, and simultaneously emits phosphorescence from the phosphorescent material and light from the phosphorescent material in an excimer state; and an electron transporting layer.

According to the aforementioned structures, the first polarizing plates are characterized in that a polarizing axis of the first polarizing plate is shifted with an angular deviation of 90 degree from the polarizing axis of the second polarizing plate. These polarizing plates have advantageous effects of preventing appearance of the background transparently and reflection.

According to another aspect of the present invention, there is provided the light emitting device, including: a pixel portion having a plurality of light emitting elements each of which has a transparent first electrode, a layer containing an organic compound in contact with a surface of the first electrode, a transparent second electrode in contact with a surface of the layer containing the organic compound; a first color filter; and a second color filter, wherein the light emitting elements simultaneously emit blue color light, phosphorescence from an organic metal complex, and light from the organic metal complex in an excimer state so as to generate white color light emission, wherein white color light emission passing through the second electrode generates full color display through the first color filter including colored layers of three colors of red, blue and green, and wherein white color light emission passing through the first electrode generates monochrome display through the second color filter which has one of the colored layers of red, blue and green.

According to the aforementioned structures, the light emitting device is one of a video camera, a digital camera, a personal computer, or a portable information terminal.

According to another aspect of the present invention, there is provided a manufacturing apparatus, including: a loading chamber; a transporting chamber connected to the loading chamber; a plurality of film formation chambers connected to the transporting chamber; and an installation chamber connected to the film formation chambers, wherein the plurality of film formation chambers is connected to a vacuum exhaust processing chamber for evacuating gas inside of each of the film formation chambers, and the plurality of film formation chambers including: a means for fixing a substrate; an alignment means for aligning masks and the substrate; one or two evaporation sources; a means for transporting the evaporation source inside the film formation chambers and the installation chamber; and a means for heating the substrate, wherein each of the plurality of film formation chambers includes: a first film formation chamber for forming a first light emitting layer which emits blue color light by vapor deposition over an electrode formed over the substrate; a second film formation chamber for forming a second light emitting layer which contains a phosphorescent material and simultaneously emits phosphorescence from the phosphorescent material and light in an excimer state by coevaporation; and a third film formation chamber for forming an electron transporting layer over the second light emitting layer by vapor deposition.

In this specification, the excimer state indicates a state in a dimer (excitation dimer) which stably exists in an excitation state generated by combining one molecule in a ground state and one molecule in an excitation state which are of same kind.

BRIEF DESCRIPTION OF THE DRAWINGS

In the accompanying drawings:

FIGS. 7A to 7C are diagrams showing an installation chamber and a state of transportation (Embodiment 3);

FIG. 8 is a cross sectional view of an evaporation apparatus (Embodiment 4);

DETAILED DESCRIPTION OF THE INVENTION

[Embodiment Modes]

Embodiment modes according to the present invention will hereinafter be explained.

[Embodiment Mode 1]

An example of a dual-sided emission type light emitting device according to the present invention will be described with reference to FIGS. 1A and 1B and FIGS. 2A to 2C.

Figure 1A:
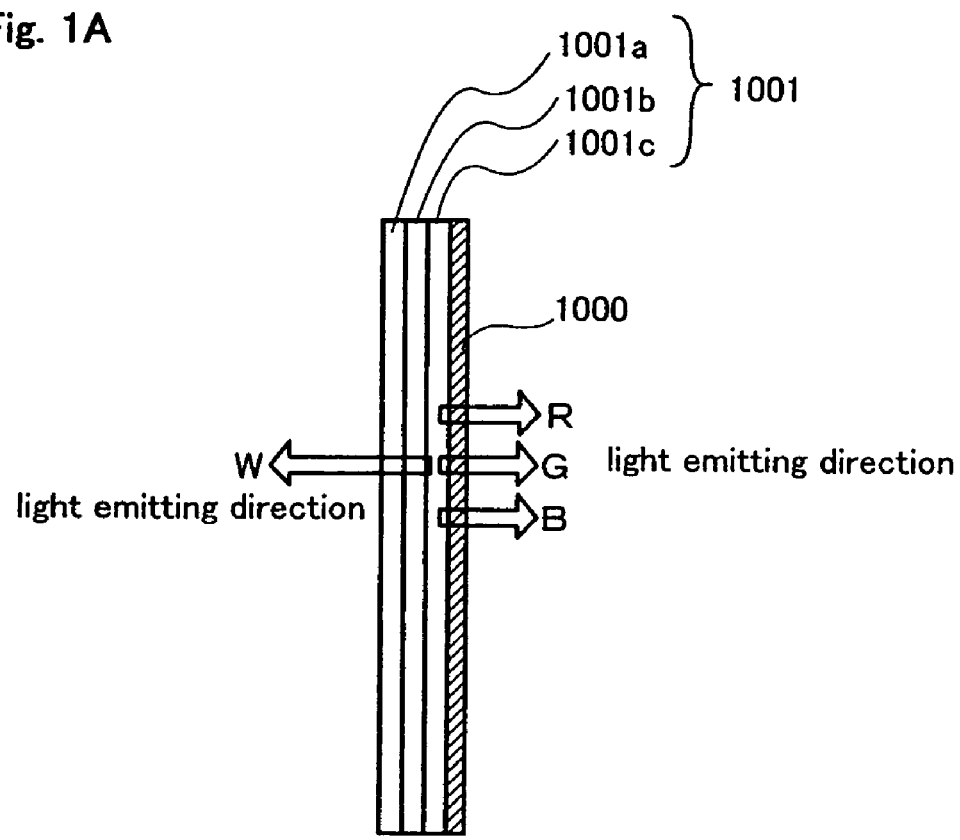
FIGS. 1A and 1B are views showing a dual-sided emission type light emitting device (Embodiment Mode 1)

In FIG. 1A, a layer 1001b containing TFTs as a switching element, and a layer 1001c containing a light emitting element including an organic compound, a cathode, and an anode are formed over a transparent substrate 1001a. The substrate 1001a and layers 1001b and 1001c constitute a white color light emitting panel 1001. Note that protective films, substrates and films for sealing are not illustrated in the drawings for the sake of omitting additional explanations.

By attaching a color filter 1000 to the white color light emitting panel 1001, a screen on one side can perform full color display.

Figure 1B:
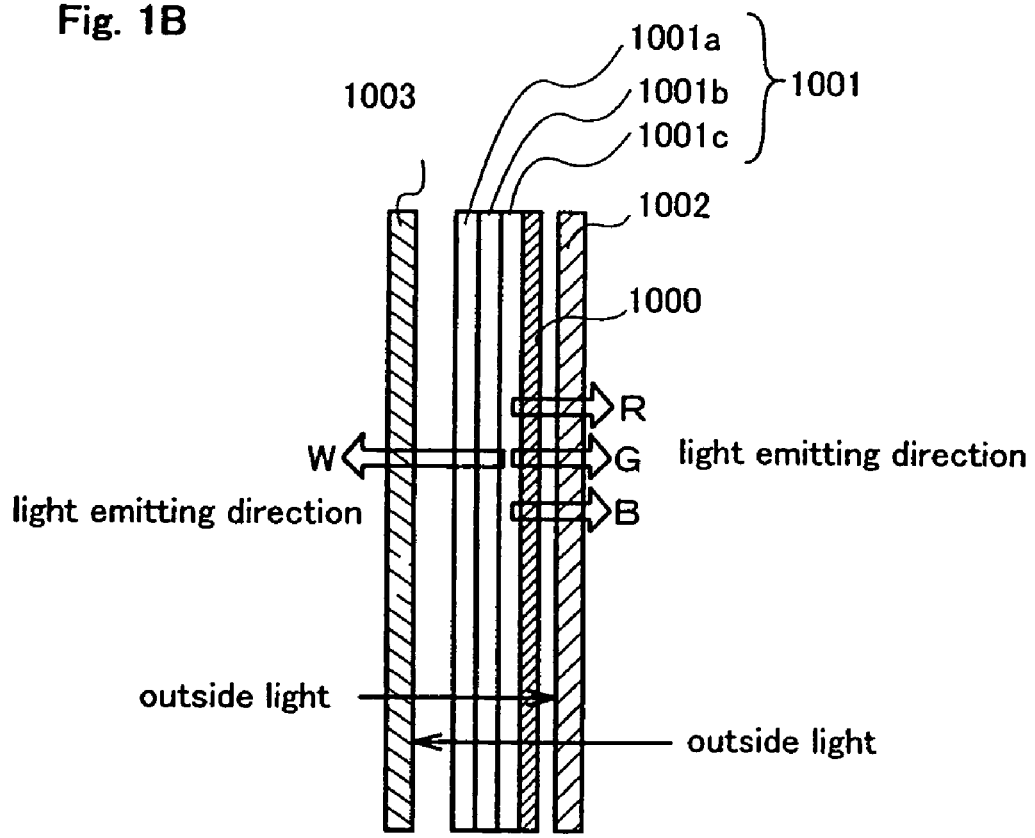

FIG. 1B shows an example in which an optical film is used for the dual-sided emission type light emitting device in order not to display background. Note that the same reference numerals are used for the identical portions in FIGS. 1A and 1B.

FIG. 1A shows a cross sectional view of the light emitting device. In order to prevent outside light from passing through the light emitting panel, the light emitting panel 1001 is sandwiched by polarizing plates 1002 and 1003. By arranging the two polarizing plates so as to make the polarizing directions of light orthogonal to each other, outside light can be blocked. Further, a light emitted from the light emitting panel 1001 passes through only one polarizing plate, permitting display.

Therefore, portions other than emitting and displaying become black, which prevents background being seen from each side of the light emitting device and also prevents display images from being hardly recognized for the viewers.

Although space is interposed between the polarizing plates 1002, 1003 and the light emitting panel 1001, the present invention is not limited to this configuration. The polarizing plates 1002, 1003 may be formed in contact with the light emitting panel 1001.

Figure 2A:
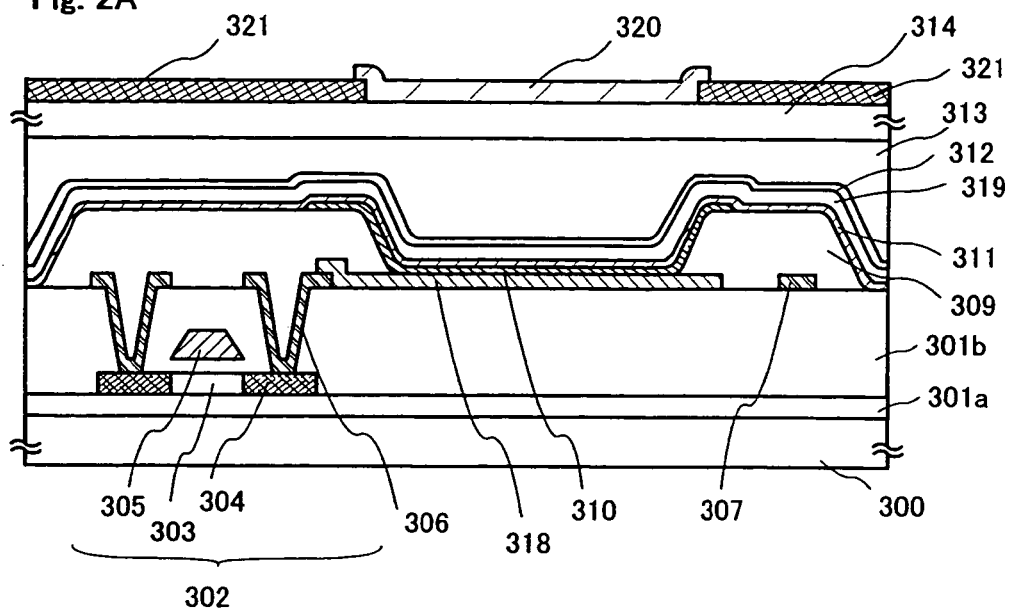
FIGS. 2A to 2C are views showing a dual-sided emission type light emitting device (Embodiment Mode 1)
Figure 2B:
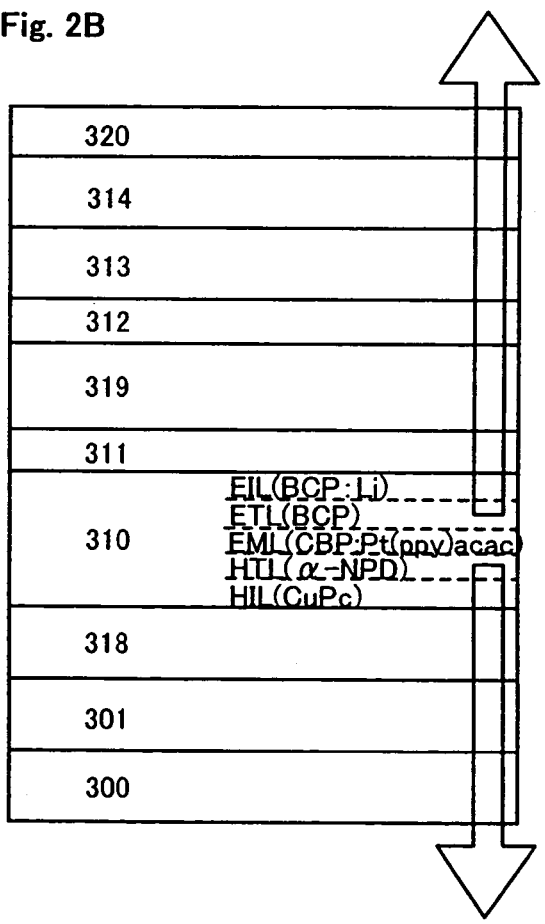

FIG. 2A is a cross sectional view showing a part of the pixel portion. FIG. 2B shows a schematic diagram for showing a lamination structure in a light emitting region. As shown in FIG. 2B, an EL layer can emit light in both directions of the top surface and the bottom surface. Note that, a stripe alignment, a delta alignment, a mosaic alignment and the like can be cited as the arrangement of the light emitting region, i.e., the arrangement of a pixel electrode.

In FIG. 2A, reference numeral 300 denotes a first substrate, reference numerals 301a and 301b denote insulating layers, reference numeral 302 denotes a TFT, reference numeral 318 denotes the first electrode (a transparent conductive layer), and reference numeral 309 denotes an insulator. Reference numeral 310 denotes an EL layer, reference numeral 311 denotes a second electrode, reference numeral 312 denotes a transparent protective layer, reference numeral 313 denotes a space, reference numeral 314 denotes the second substrate, reference numeral 320 denotes a colored layer, and reference numeral 321 denotes a light shielding layer.

The TFT 302 (p-channel TFT) formed over the first substrate 300 is an element for controlling current flowing in the light emitting EL layer 310, and reference numeral 304 denotes a drain region (or a source region). Further, reference numeral 306 denotes a drain electrode (or a source electrode) that connects the first electrode and the drain region (or the source region). Further a wiring 307, such as an electric power source line or a source wiring, is formed at the same time as the drain electrode 306, using the same process. An example in which the first electrode and the drain electrode are formed separately is shown here, but they may also be formed at the same time. An insulating layer 301a that becomes a base insulating film (a nitride insulating film as a lower layer, and an oxide insulting film as an upper layer here) is formed over the first substrate 300, and a gate insulating film is formed between a gate electrode 305 and an active layer. Further, reference numeral 301b denotes an interlayer insulating film containing an organic material or an inorganic material. Further, although not shown here, an additional TFT or a plurality of TFTs (n-channel TFT or p-channel TFT), may also be formed in one pixel. Furthermore, although a TFT having one channel forming region 303 is shown here, the present invention is not limited in particular to this, and a TFT having a plurality of channel forming regions may also be used.

Further, reference numeral 318 denotes the first electrode formed of the transparent conductive film, that is, an anode (or a cathode) of an EL element. Examples of the transparent conductive film include ITO (indium tin oxide), indium oxide-zinc oxide ($In_2O_3$—ZnO), a zinc oxide (ZnO), and the like.

Further, the insulator 309 (also referred to as a bank, a partition wall, a barrier, an embankment, or the like) covers edge portions of the first electrode 318 (and the wiring 307). Inorganic materials (such as silicon oxide, silicon nitride, and silicon oxynitride), photosensitive organic materials and non-photosensitive organic materials (such as polyimide, acrylic, polyamide, polyimide amide, resist, and benzocyclobutene), laminates of these materials, and the like can be used as the insulator 309. A photosensitive organic resin covered with a silicon nitride film is used here. It is preferable to provide a curved surface having a radius of curvature only in an upper edge portion of the insulator when using a positive type photosensitive acrylic as the organic resin material, for example. Further, negative type photosensitive organic materials, which become insoluble in etchants by exposure to light, and positive type photosensitive organic materials, which become soluble in etchants by exposure to light, can be used as the insulator.

Furthermore, a layer 310 containing an organic compound is formed by using the vapor deposition or an application method. The layer 310 containing the organic compound is formed by an evaporation apparatus so as to make a film thickness uniform. Note that, in order to improve reliability, the vacuum heat treatment (between 100° C. and 250° C.) is preferably performed immediately before forming the layer 310 containing the organic compound, thus performing degassing. For example, if the vapor deposition is used, evaporation is performed in a film formation chamber that has been vacuum-exhausted to a pressure equal to or less than $5 \times 10^{-3}$ Torr (0.665 Pa), preferably between $10^{-6}$ and $10^{-4}$ Pa. The organic compound is gasified in advance by resistive heating in vapor deposition, and is dispersed toward the substrate by opening a shutter at the time of the vapor deposition. The gasified organic compound is dispersed upward, and is evaporated on the substrate after passing through an opening portion formed in a metal mask.

As shown in FIG. 2B, the EL layer (layer containing the organic compound) 310 is composed by sequentially laminating a hole injection layer (HIL), a hole transporting layer (HTL), a light emitting layer (EML), an electron transporting layer (ETL), and an electron injection layer (EIL) from the anode side. CuPc as the HIL, α-NPD as the HTL, CBP including an organic metal complex in which platinum is used as a central metal (Pt(ppy)acac) as the EML, bathocuproin (BCP) as the ETL, and BCP:Li as the EIL are typically used, respectively. White color light emission can be obtained in accordance with the lamination layer having above-described structure. Note that, the CBP is an abbreviation of 4,4'-N,N'-dicarbazole-biphenyl.

As the EL layer 310, a thin film formed of light emitting materials (singlet compound) which emit light (fluorescence) by a singlet excitation and a thin film formed of light emitting materials (triplet compound) which emit light (phosphorescence) by a triplet excitation can be employed.

The EL layer 310 has following characteristics. According to the present invention, white color light emission can be obtained with a simple lamination structure by utilizing the organic metal complex which uses platinum as the central metal. The white light emission can be further obtained by using at least a first light emitting layer that emits blue color light and a second light emitting layer that simultaneously emits phosphorescence and excimer light emission.

As the first light emitting layer that emits blue color light, a layer composed of a single substance (blue-color light emitter) or a layer formed by dispersing (or mixing) a guest material which is blue-color light emitter to the host material can be employed.

Excimer emission is appeared in a region having a longer wavelength (more specifically, having a longer wavelength by no less than several dozen nm) as compared to normal light emission (phosphorescence if the phosphorescent material is used). Therefore, excimer emission of the phosphorescence material that generates phosphorescence in a green color region appears in a red color region. Accordingly, peaks in the respective wavelength regions of red color, green color and blue color can be obtained by the excimer emission, and therefore a white-color organic light emitting element with high-efficiency can be achieved.

As the specific example, for instance, there is a method in which the phosphorescent material having excellent planarity as a platinum complex is used as the guest material, and the concentration of the phosphorescent material is increased (more specifically, not less than 10 wt %). By mixing the phosphorescent material at a high concentration of not less than 10 wt % with the host material, the interaction between molecules or polymer thereof of the phosphorescent material is increased, which results in the derivation of the excimer emission. In addition, there is another method in which the phosphorescence material is used as a thin film light emitting layer or a dot light emitting region rather than using the phosphorescent material as the guest material. Note that the method for leading out the excimer emission is not limited thereto.

Figure 2C:
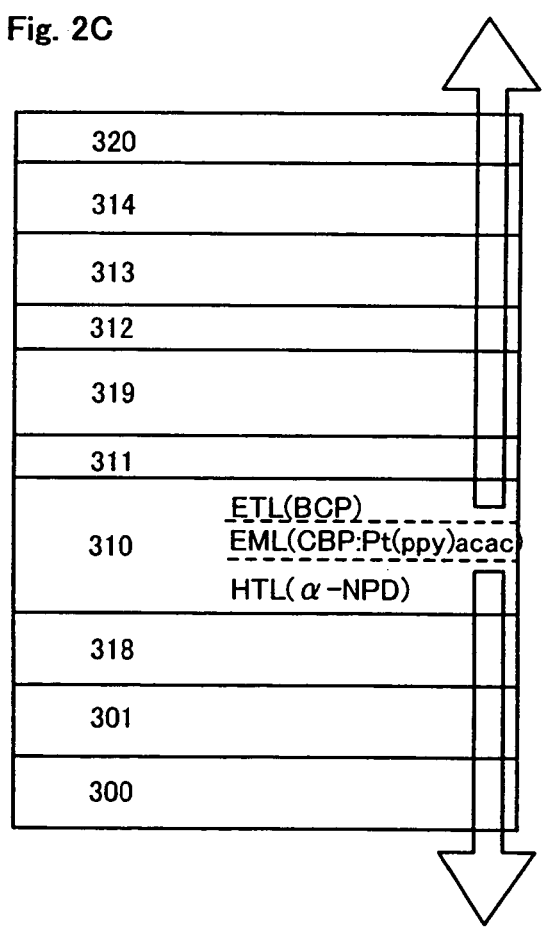

FIG. 2C is an example showing a simplest lamination structure. In this example, a HTL (α-NPD: film thickness of 30 nm), and an EML (CBP containing Pt(ppy)acac: film thickness of 30 nm), and an ETL (BCP: film thickness of 20 nm) are sequentially laminated from the anode side. The triplet compound represented by Pt(ppy)acac has a high light-emitting effeciency, and is effective in a large-sized panel. As illustrated in FIG. 2C, the EL layer is formed by laminating three layers, which results in reduction of the processing time. Further, increase in the number of the evaporation chambers for the manufacturing device can be suppressed, which is preferable for mass production. Furthermore, each layer is a thin film with a thickness of between 20 nm and 30 nm, and thin film is superior in material costs.

Further, reference numeral 311 denotes the second electrode made of a conductive film, that is, a cathode (or anode) of the light emitting element. Alloy such as MgAg, MgIn, AlLi, inorganic materials such as $CaF_2$, and CaN, or a transparent film containing aluminum with an element included in Group I or Group II of the periodic table by coevaporation, may be used as the material for the second electrode 311. The dual-sided emission type light emitting device emits light by passing light through the second electrode is manufactured here, and therefore a 1 nm to 10 nm thick aluminum film, or a MgAg alloy film is used. If an Ag film is employed as the second electrode 311, it becomes possible to form a material over the layer 310 containing the organic compound by using a material other than an oxide and the reliability of the light emitting device can be enhanced. Further, a transparent layer (film thickness 1 nm to 5 nm) containing $CaF_2$, $MgF_2$, or $BaF_2$ may also be formed as a cathode buffer layer before forming the Ag film with the thickness of 1 nm to 10 nm.

In order to lower the resistance of the cathode, the transparent conductive film (such as an ITO (indium tin oxide) film, an indium oxide-zinc oxide ($In_2O_3$—ZnO) film, or a zinc oxide (ZnO) film) may be formed to a thickness of between 50 nm and 200 nm. In order to lower the resistance of the cathode, an auxiliary electrode may also be formed over the second electrode 311 in a region which does not emit light. The cathode may be evaporated by resistive heating and selectively formed by using the evaporation mask.

Reference numeral 312 denotes a transparent conductive layer formed by sputtering or vapor deposition. The transparent conductive layer serves as a sealing film for protecting the second electrode 311 made of a thin metal film and preventing penetration of moisture. As depicted in FIG. 2B, a silicon nitride film, silicon oxide film, a silicon oxynitride film (SiNO film (a composition ratio of N>O) or SiON film (a composition ratio of N<O)), or a thin film containing carbon as its main component (for example, DLC film and CN film) obtained by sputtering or CVD can be used for forming the transparent conductive layer 312.

The transparent conductive layer 312 thus obtained is optimal for the sealing film of the light emitting element in which the layer containing the organic compound is used as the light emitting layer.

The second substrate 314 and the first substrate 300 are bonded by a sealing material (not shown). The sealing material includes a gap material for securing a space between the substrates, and is arranged so as to surround the pixel region. The space 313 is filled with an inert gas, and a desiccant (not shown) is attached to the second substrate 314. Further, the space 313 may be filled with a transparent sealing material. In this case, UV curing epoxy resin or thermosetting epoxy resin can be used. The transparent sealing material is filled between the pair of substrates, which enhances the entire transmittance as compared with the case in which the gap between the pair of substrate is a space (inert gas).

Further, a color filter is attached to the second substrate 314 according to the arrangement of the light emitting regions. The color filter includes colored layers 320 corresponding to red color (R), green color (G), and blue color (B), a light shielding layer 321 for shielding light between the colored layers, and an overcoat layer (not illustrated). Although Embodiment Mode 1 shows an example in which the color filter is attached to the outside surface of the second substrate 314, the color filter may be attached to the inside surface. In this case, white color light emission passes through the second substrate after passing through the color filter.

According to the present invention, it is possible to achieve a novel mode of light emitting display device in which one sheet panel comprises two display screens, and one of white color light emission passing through the anode and white color light emission passing through the cathode is displayed in full color and the other is displayed in monochrome.

[Embodiment Mode 2]

Figure 5:
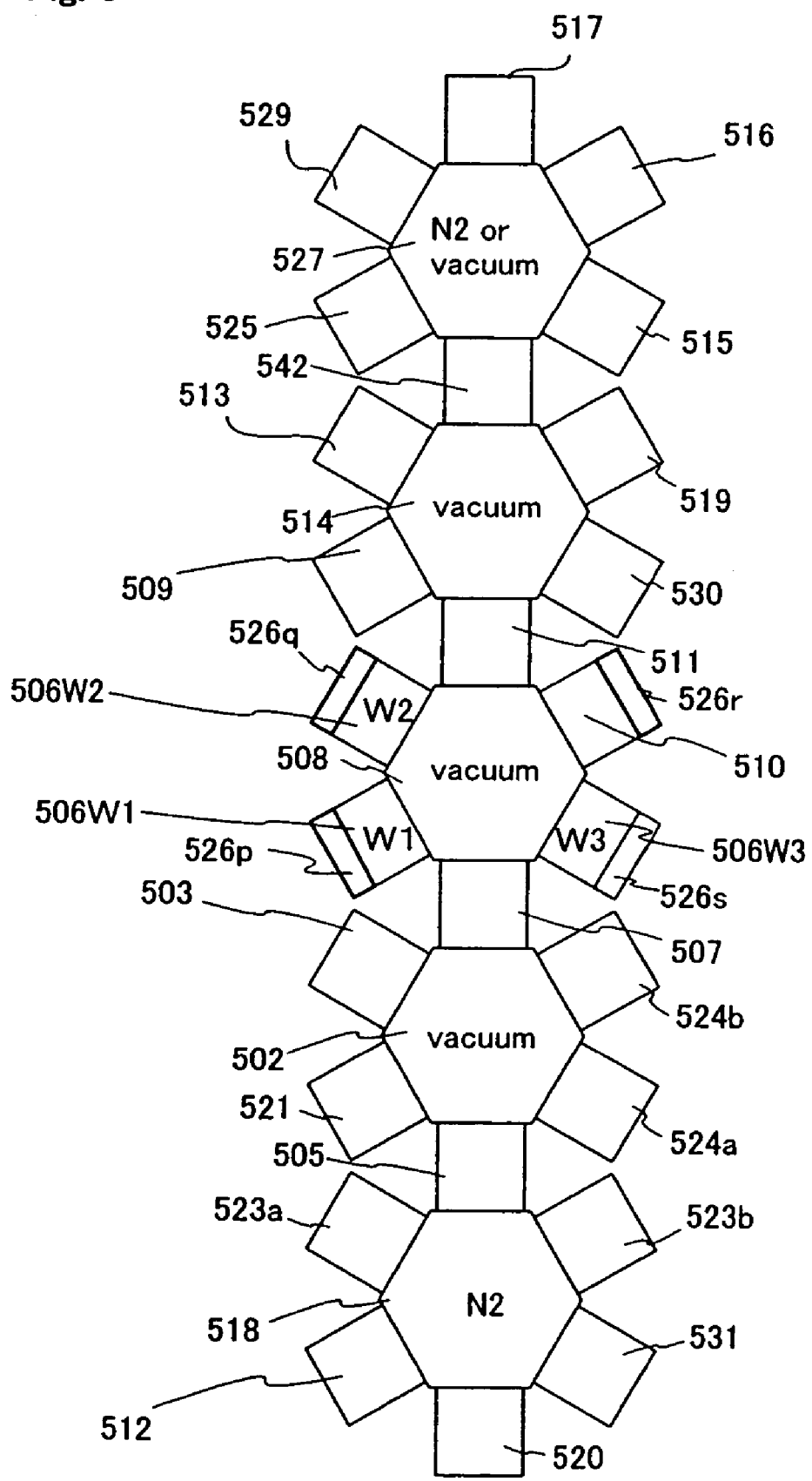
FIG. 5 is a diagram showing a multi-chamber manufacturing device (Embodiment Mode 2)

FIG. 5 shows a top view of a multi-chamber type manufacturing device. In the manufacturing device as depicted in FIG. 5, chambers are arranged for the purpose of enhancing its production efficiency.

In the manufacturing device as depicted in FIG. 5, at least transporting chambers 502, 508 and 514 are always maintained in vacuum, and film formation chambers 506W1, 506W2, and 506W3 are always maintained in vacuum. Accordingly, a vacuum exhaust operation within the film formation chambers and nitrogen filing operation within the film formation chambers can be omitted, and therefore film formation treatment can be subjected in succession at short times.

In one film formation chamber, only one layer in the EL layers including layers formed of different materials (such as a hole transporting layer, a hole injection layer, a light emitting layer, an electron transporting layer, and an electron injection layer) is formed. Movable evaporation source holders are installed within each of the film formation chambers. In each film formation chamber, a plurality of such evaporation source holders are prepared and appropriately provided with a plurality of container (crucibles) which have been filled with an EL material in advance. A substrate is set in a face down manner, a position alignment of an evaporation mask is performed by CCD or the like. Then, film formation can be selectively performed by executing vapor deposition by means of resistive heating.

Installation of the containers (crucibles) encapsulated with the EL material or component replacement of the evaporation source holders is carried out in installation chambers 526p, 526q, 526r, and 526s. The EL material has previously been put in the containers (crucibles as a typical example) by a material manufacturer. Namely, such setting is preferably executed without exposing the EL material to the air; therefore, it is preferable that, when crucible is delivered from the material manufacturer, the crucible is put in a second container in a sealed manner and then introduced into the film formation chamber as it is. Desirably, each of installation chambers is allowed to be in a vacuum state, and under these circumstances the crucible is taken out of the second container in any one of the installation chambers to set the crucible in any one of the evaporation source holders. In such manner, not only the crucible but also the EL material put in the crucible is prevented from being contaminated.

According to the present invention, the white color light emitting element is realized by laminating the three layers containing the organic compound. Therefore, the layers containing the organic compound may be formed by using at least three chambers. By using three chambers, processing time can be reduced, which further reduces cost for the manufacturing device. In addition, each layer may be a thin film with a film thickness of 20 nm to 40 nm, which is superior in material cost.

In case of forming the white color light emitting element, for instance, a hole transporting layer (HTL), which also becomes the first light emitting layer is formed in the film formation chamber 506W1, the second light emitting layer is formed in the film formation chamber 506W2, an electron transporting layer (ETL) is formed in the film formation chamber 506W3, and then a cathode may be formed in the film formation chamber 510. A blue color fluorescent material having a hole transporting property such as TPD, and α-NPD may be used as a light emitter in the first light emitting layer. Further, the organic metal complex using platinum as its central material is effective for the light emitter in the second light emitting layer. More specifically, when substances as described in the following chemical formulas (1) to (4) are mixed with the host material at a high concentration (between 10 wt % and 40 wt %, more preferably, between 12.5 wt % and 20 wt %), the second light emitting layer can emit phosphorescent emission and excimer emission. Note that present invention is not limited to the materials, and any material can be used as long as the material is a phosphorescent material that simultaneously emits phosphorescent emission and excimer emission.

[Chemical Formula 1]

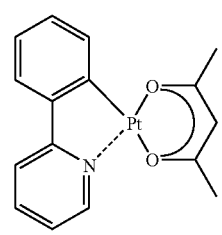

(1)

-continued

[Chemical Formula 2]

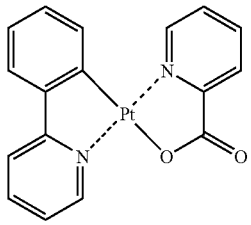

(2)

[Chemical Formula 3]

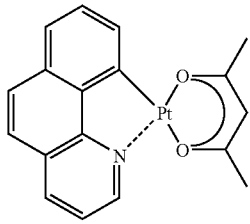

(3)

[Chemical Formula 4]

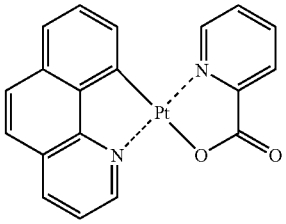

(4)

Examples of the electron transporting material that can be used for the electron transporting layer (ETL) include: metal complexes such as tris(8-quinolinolato)aluminum (abbreviated as Alq$_3$), tris(4-methyl-8-quinolinolato)aluminum (abbreviated as Almq$_3$), and bis(10-hydroxybenzo[h]-quinolinate)beryllium (abbreviated as BeBq$_2$), bis(2-methyl-8-quinolinolato)-(4-hydroxy-biphenyly)-aluminum (abbreviated as BAlq), bis[2-(2-hydroxypheyl)-benzoxazolato]zinc (abbreviated as Zn(BOX)$_2$), and bis[2-(2-hydroxypheyl)-benzothiazolato]zinc (abbreviated as Zn(BTZ)$_2$). Other materials that are capable of transporting electrons than the metal complexes include: oxadiazole derivatives such as 2-(4-biphenylyl)-5-(4-tert-butylphenyl)-1,3,4-oxadiazole (abbreviated as PBD) and 1,3-bis[5-(p-tert-butylphenyl)-1,3,4-oxadiazole-2-yl]benzene (abbreviated as OXD-7); triazole derivatives such as 3-(4-tert-butylphenyl)-4-phenyl-5-(4-biphenylyl)-1,2,4-triazole (abbreviated as TAZ) and 3-(4-tert-butylphenyl)-4-(4-ethylpheyl)-5-(4-biphenylyl)-1,2,4-triazole (abbreviated as p-EtTAZ); imidazole derivatives such as 2,2',2"-(1,3,5-benzenetrile)tris-[1-phenyl-1H-benzimidazole] (abbreviated as TPBI); and phenanthroline derivatives such as bathophenanthroline (abbreviated as BPhen) and bathocuproin (abbreviated as BCP).

Particularly, the second light emitting layer may be formed by mixing one kind of metal complex with the host material at a high concentration (between 10 wt % and 40 wt %, more preferably, between 12.5 wt % and 20 wt %) by means of coevaporation, permitting easy control of the concentration thereof. Therefore, the second light emitting layer is suitable for mass production.

A region other than the portion in which a leading electrode is exposed (where will subsequently be attached with a FPC) is simply masked with an evaporation mask.

In order to form a dual-sided light emitting panel, the cathode is formed by laminating a thin metal film and transparent conductive film. The thin metal film (Ag or MgAg) is formed to a thickness of between 1 nm and 10 nm by resistive heating, whereas the transparent conductive film is formed by sputtering. Therefore, the cathode is formed at short times.

In Embodiment Mode 2, an example of manufacturing the white color light emitting panel is shown. However, it is also possible to form another monochromatic (such as green color, red color, blue color, or the like) light emitting panel.

Next, procedures for manufacturing the light emitting device will hereinafter be described. A substrate with an anode (the first electrode) and an insulator (partition wall) covering edge portions of the anode previously formed thereon is transported into the manufacturing device as depicted in FIG. 5, thereby the light emitting device is manufactured. In case of manufacturing an active matrix type light emitting device, a plurality of thin film transistors (current controlling TFTs) connected to the anode, a plurality of other thin film transistors (switching TFTs), and driver circuits including thin film transistors are formed over the substrate in advance. Meanwhile, it is also possible to manufacture a simple matrix type light emitting device by means of the manufacturing device as depicted in FIG. 5.

At first, the substrate (600 mm×720 mm) is set in a substrate installation chamber 520. A large area substrate having a size of, for example, 320 mm×400 mm, 370 mm×470 mm, 550 mm×650 mm, 600 mm×720 mm, 680 mm×880 mm, 1000 mm×1200 mm, 1100 mm×1250 mm or 1150 mm×1300 mm may also be employed.

The substrate (on which the anode and the insulator covering the edge portion of the anode are formed) that is set in the substrate installation chamber 520 is transported into a transporting chamber 518. A transporting mechanism (such as a transporting robot) for transporting or inverting the substrate is provided in the transporting chamber 518.

In the transporting chambers 508, 514, and 502, the transporting mechanisms and vacuum exhaust means are provided, respectively. The transporting robot provided in the transporting chamber 518 can invert the substrate and transport the inverted substrate into a delivery chamber 505. Since the delivery chamber 505 is connected to a vacuum exhaust processing chamber, the inside of the delivery chamber 505 can be vacuum-exhausted to be in a vacuum state, or after vacuum exhaust, an inert gas is introduced to produce an atmospheric pressure in the delivery chamber 505.

Moreover, the vacuum exhaust processing chamber is equipped with a magnetic levitated type turbo molecular pump, a cryopump, or a dry pump. By utilizing these pumps, it is possible to make the ultimate pressure of the transporting chamber be $10^{-5}$ to $10^{-6}$ Pa, and further, reverse diffusion of impurities from the pump side and exhaust system can be controlled. In order to prevent impurities from being introduced into the interior of the apparatus, an inert gas such as nitrogen gas and rare gas are used as a gas to be introduced. For these gases introduced into the apparatus, gases highly purified by a gas purifier prior to the introduction into the interior of the apparatus are used. Therefore, it is required that a gas purifier is implemented so that the gas is introduced into the evaporation apparatus following the high purification of the gas. Since by utilizing this, oxygen, moisture and other impurities contained in the gas can be previously removed, which prevents the impurities from being introduced into the interior of the apparatus.

Prior to installation of the substrates into the substrate installation chamber 520, in order to reduce point defects, it is preferable that a surface of the first electrode (anode) is cleaned by using a porous sponge (for example, being made of polyvinyl alcohol (PVA), or nylon) impregnated with surfactant (being alkalescent), thereby washing away dust from a surface thereof. As for a cleaning mechanism, a cleaning device having a roll brush (for example, made of PVA) which contacts a face of a substrate such that the roll brush rotates around an axis line parallel to the surface of the substrate may be used, or another cleaning device having a disk brush (for example, made of PVA) which contacts a surface of a substrate such that the disk brush rotates around an axis line vertical to the surface of the substrate may be used.

The substrate is transported from the transporting chamber 518 into the delivery chamber 505, and further the substrate is transported from the delivery chamber 505 to the transporting chamber 502 without being exposed to the atmospheric air.

Further, it is preferable to perform vacuum heating just before evaporation of the film containing the organic compound in order to prevent a shrinkage, and the substrate is transferred from the transporting chamber 502 into the multistage vacuum heating chamber 521 and annealing for degassing is performed in vacuum (less than $5 \times 10^{-3}$ Torr (0.665 Pa), preferably $10^{-4}$ to $10^{-6}$ Pa), in order to remove moisture and other gas contained in the above substrate completely. In the multistage vacuum heating chamber 521, a flat heater (typically, a sheath heater) is used to heat a plurality of substrates uniformly. A plurality of the flat heaters can be disposed to heat the substrate from both sides as sandwiching the flat heaters. Of course, the flat heater can heat the substrate from one side. Particularly, when an organic resin film is used as a material for an interlayer insulating film or a barrier wall, some organic resin materials tend to absorb moisture, which could lead to further deaeration. Thus, it is effective to perform vacuum heating in which the substrate is annealed at temperatures of 100 to 250° C., preferably 150 to 200° C. for 30 minutes or more, and then naturally cooled for 30 minutes, for example, to remove absorbed moisture before the layer containing organic compounds is deposited.

In addition to vacuum heating, ultraviolet ray (UV) may be irradiated to the substrate during heating at 200 to 500° C. under an inert gas atmosphere. Further, without conducting the vacuum heating, it is also possible to carry out a UV irradiating treatment while the substrate is heated at 200 to 500° C. under the inert gas atmosphere.

In the film formation chamber 512, a hole injection layer may be formed of a polymeric material by ink jetting, spin coating, spraying or the like under the atmospheric pressure or reduced pressure, if necessary. Further, after the application by ink jetting, the film thickness may be uniformized by use of a spin coater. As well as ink jetting, after the application is carried out by spraying, the film thickness may also be uniformized by use of the spin coater. Furthermore, the film formation may be carried out by vertically setting the substrates in a vacuum by ink jetting.

In the film formation chamber 512, for instance, an aqueous solution of poly(ethylene dioxythiophene)/poly (styrene sulfonic acid) (PEDOT/PSS), an aqueous solution of polyaniline/camphor sulfonic acid (PANI/CSA), PTP-DES, Et-PTPDEK, PPBA, or the like, which acts as a hole injection layer (anode buffer layer) may be applied over the entire surface of the first electrode (anode), and fired. It is preferable to perform firing in multistage heating chambers 523a and 523b.

Levelness can be improved for cases in which a hole injection layer (HIL) made of a high molecular weight material formed by an application method using a spin coater or the like. The coverage and uniformity in film thickness are made satisfactory for films formed thereupon. In particular, uniform light emission can be obtained since the film thickness of the light emitting layers becomes uniform. In this case, it is preferred to perform vacuum heating (at 100 to 200° C.) after forming the hole injection layer by application, and immediately before film formation by vapor deposition.

Note that processes of the invention is performed, for example, by the following processes including: the surface of the first electrode (anode) is cleaned by using a sponge; the substrate is carried in the substrate installing chamber 520 and transferred to the film formation chamber 512a; an aqueous solution of poly(ethylene dioxythiophene)/poly (styrene sulfonic acid) (PEDOT/PSS) is applied on the entire surface of the first electrode by spin coating to a film thickness of 60 nm; the substrate is transferred to the multistage heating chambers 523a and 523b and is provisionally fired at 80° C. for 10 minutes, and then fired at 200° C. for one hour; the substrate is transferred to the multistage vacuum heating chamber 521, vacuum heating (heating for 30 minutes at 170° C., then cooling for 30 minutes) is performed immediately before evaporation; and the substrate is transported to the film formation chambers 506W1, 506W2, 506W3 and the EL layer is formed by evaporation without exposure to the air. In particular, in case that the ITO film is used as the anode and unevenness or minute particles exists on the surface of the ITO film, the adverse influences of unevenness or minute particles can be reduced by making the PEDOT/PSS film with a thickness of not less than 30 nm. Further, ultraviolet irradiation is preferably performed in an UV treatment chamber 531 in order to improve the wettability of the PEDOT/PSS film.

Further, the PEDOT/PSS film is formed over the entire surface when PEDOT/PSS is formed by spin coating, and therefore it is preferable to selectively remove the PEDOT/PSS film from edge surfaces and peripheral portions of the substrate, and regions that connect to terminal portions, connecting regions between the cathodes and lower wirings, and the like. It is preferable to remove the PEDOT/PSS film by employing $O_2$ ashing or the like using a mask in the pretreatment chamber 503. The pretreatment chamber 503 has a plasma generating means, and dry etching is performed by exciting one gas or a plurality of gases selected from Ar, H, F, and O, thus generating a plasma. By using the mask, unnecessary portions can be selectively removed.

Note that the evaporation mask is stocked in mask stacking chambers 524a and 524b and is arbitrarily transferred to the film formation chamber when vapor deposition is carried out. Since the mask area is enlarged when a large size substrate is used, a frame for fixing the substrate becomes larger. Therefore, it is difficult to stock a lot of masks in one mask stocking chamber. In Embodiment Mode 2, two mask stocking chambers are provided for the sake of overcoming the aforementioned problem. Cleaning of the evaporation mask may be performed in the mask stocking chambers 524a and 524b. Further, when performing vapor deposition, the mask stocking chambers are available, which permits to stock substrates with films formed thereon or processed substrates.

The substrates are transferred from the transporting chamber 502 into the transporting chamber 508 via the delivery chamber 507 without exposing the substrate in the atmospheric air.

The substrates are further sequentially transferred to the film formation chambers 506W1, 506W2 and 506W3, which are connected to the transporting chamber 508 such that organic compound layers formed of a low-molecular-weight compound material, which will respectively serve as the hole transporting layer, the light emitting layer, and the electron transporting layer, are arbitrarily formed. The organic compound layers are formed by arbitrarily selecting the EL materials, which makes it possible to form the light emitting element emitting monochromatic light (specifically, white color light) by the whole light emitting element. Note that the substrates are transferred to the respective transporting chambers via the delivery chambers 540, 541, and 511 without being exposed to the atmospheric air.

Next, the substrate is transported into the film formation chamber 510 by a transporting mechanism provided in the transporting chamber 514 such that a cathode is formed over the substrate in the film formation chamber 510. The cathode is preferably formed of a transparent material or a translucent material. More specifically, following materials are preferably used as the cathode: a thin film (with a thickness of 1 to 10 nm) of metal film (a film of an alloy of, for example, MgAg, MgIn, inorganic material of $CaF_2$, LiF, or CaN, a film formed by using an element belonging to group I or II in the periodic table and aluminum by means of coevaporation, or a laminate thereof) formed by vapor deposition utilizing resistive heating; or a lamination layer of the aforementioned thin metal film (with a thickness of 1 to 10 nm) and the transparent conductive film. The substrate is transported from the transporting chamber 508 into the transporting chamber 514 via the delivery chamber 511, and then the substrate is subsequently transported into the film formation chamber 509 so as to form the transparent conductive film by sputtering.

The light emitting element having a lamination structure which includes the layer containing the organic compound is formed according to the aforementioned processes.

It is also possible to transfer the substrate into the film formation chamber 513 connected to the delivery chamber 514 so as to form a protective film containing a silicon nitride film or a silicon oxynitride film. Here, a target containing silicon, a target containing silicon oxide, or a target containing silicon nitride is provided in the film formation chamber 513.

The protective film may be formed by moving a rod-shaped target relative to the fixed substrate. Further, the protective film may be formed by moving the substrate relative to a fixed rod-shaped target.

For instance, by using a disk target containing silicon, an atmosphere in the film formation chamber is set to be a nitrogen atmosphere or an atmosphere containing nitrogen and argon, so that a silicon nitride film can be formed over the cathode. A thin film (DLC film, CN film, or amorphous carbon film) containing carbon as its main component may be formed as a protective film, and a film formation chamber using CVD may be additionally provided. A diamond-like carbon film (also referred to as a DLC film) can be formed by plasma CVD (typically, RF plasma CVD, microwave CVD, electron cyclotron resonance (ECR) CVD, hot-filament CVD, or the like), a combustion flame method, sputtering, ion-beam evaporation, laser evaporation, or the like. A reaction gas used in the film formation is a hydrogen gas and a hydrocarbon group gas (for example, $CH_4$, $C_2H_2$, $C_6H_6$, or the like). The reaction gas is ionized by glow discharge, and resultant ions are accelerated and impacted to the cathode which is negatively self-biased to form a film. A CN film may be formed by using $C_2H_4$ gas and $N_2$ gas as reaction gases. The DLC film and the CN film are insulating films which are transparent or translucent with respect to visible light. The transparency with respect to the visible light means that a transmittance of the visible light ranges from 80 to 100%, and the translucence means that a transmittance of the visible light ranges 50 to 80%.

As a substitute for the above-mentioned protective film, it is possible to form a protective film by laminating the first inorganic insulating film, a stress relaxation layer, and the second inorganic insulating film. For instance, it is permissible that, after the cathode is formed, the substrate is transported into the film formation chamber 513 where the first inorganic insulating film is formed with a thickness of 5 to 50 nm, and, then the resultant substrate is transported into the film formation chamber 506W1, 506W2, or 506W3 where the stress relaxation layer (such as an inorganic layer, and a layer containing an organic compound) having a hygroscopic property and transparency is formed to a thickness of 10 to 100 nm thereon and, thereafter, the resultant substrate is transported back to the film formation chamber 513 where the second inorganic insulating film is formed thereon with a thickness of 5 to 50 nm.

Next, the substrate on which the light emitting element is formed is transported into the sealing chamber 519.

A sealing substrate is set in a loading chamber 517 from the outside and ready to be processed. The sealing substrate is transported from the loading chamber 517 into the transporting chamber 527. The sealing substrate is further transported into an optical film bonding chamber 529 for bonding a desiccant or an optical filter (such as a color filter, and a polarizing film), if required. In addition, the sealing substrate attached with the optical film (such as the color filter and a polarizing plate) thereto may be previously set in the loading chamber 517.

In order to remove impurities such as moisture contained in the sealing substrate, annealing is preferably performed in the multistage heating chamber 516 in advance. In case of forming a sealing material for bonding the substrate with the light emitting element formed thereon to the sealing substrate, the sealing material is formed in a dispenser chamber 515, and the sealing substrate with the sealing material formed thereon is transported into the transporting chamber 514 via the delivery chamber 542, and then the resultant sealing substrate is transported into the sealing substrate stocking chamber 530. Note that, although an example of forming the sealing material on the sealing substrate is shown here, the present invention is not particularly limited thereto, and the sealing substrate may be formed over the substrate on which the light emitting element is formed. Further, the evaporation mask, which is used in vapor deposition, may be stocked in the sealing substrate stocking chamber 530.

When the dual-sided light emission structure is formed according to Embodiment Mode 2, the sealing substrate may be transported into the optical film bonding chamber 529, and the optical film may be attached to inside of the sealing substrate. Or, after bonding the substrate with the light emitting element formed thereon and the sealing substrate, the sealing substrate may be transported into the optical film bonding chamber 529, and then the optical film (the color filter or the polarizing plate) is attached to the outside of the sealing substrate.

Next, the substrate and the sealing substrate is bonded in the sealing chamber 519, a UV light is irradiated to the pair of substrates bonded to each other by use of an ultraviolet irradiation mechanism that is provided in the sealing chamber 519 so as to cure the sealing material. It is preferred to irradiate the UV light from the sealing substrate side where is not provided with a TFT that shields light. The sealing material formed by mixing UV curing resin and a thermosetting resin is used as the sealing material here. However the present invention is not limited thereto as long as it is an adhesive, and only the UV curing resin may also be used.

The sealed space may not be filled with the inert gas, but may be filled with resin. When the UV light is irradiated from the sealing substrate side in case of a bottom emission type, since the cathode does not allow light to pass therethrough, the resin material filled to the sealed space is not particularly limited, and the UV curing resin or a opaque resin may be used. On the other hand, when the ultraviolet light is irradiated from the sealing substrate side in case of a dual sided light emission type, the UV light passes through the cathode, causing damage against the EL layer. Therefore, it is preferable that the UV curing resin is not used in case of the dual-sided emission type. As result, in case of the dual sided light emission type, the transparent thermosetting resin is preferably used for the resin filled to the sealed space.

Subsequently, the bonded pair of substrates is transported from the sealing chamber 519 into the transporting chamber 514, and then the pair of substrates is taken out from the transporting chamber 527 into an extraction chamber 525 via the delivery chamber 542.

After taking out the pair of substrates from the extraction chamber 525, the sealing material is cured by a heating treatment. When the thermosetting resin is filled in the sealed space in case of the top emission type, the thermosetting resin can be cured along with the heating treatment of the sealing material at the same time.

As set forth above, by using the manufacturing apparatus as depicted in FIG. 5, the light emitting element can be completely formed until it is encapsulated in the sealed space without being exposed into the atmospheric air, permitting the fabrication of the light emitting device with high reliability.

Note that a controlling apparatus, which realizes total automation by controlling a pathway along with which the substrate is moved into each treatment chamber, is provided in the manufacturing apparatus, although it is not illustrated in the drawings.

EMBODIMENTS

The present invention that includes the above-described structure will be described in more detail with the following embodiments.

[Embodiment 1]

Figures 3A, 3B:
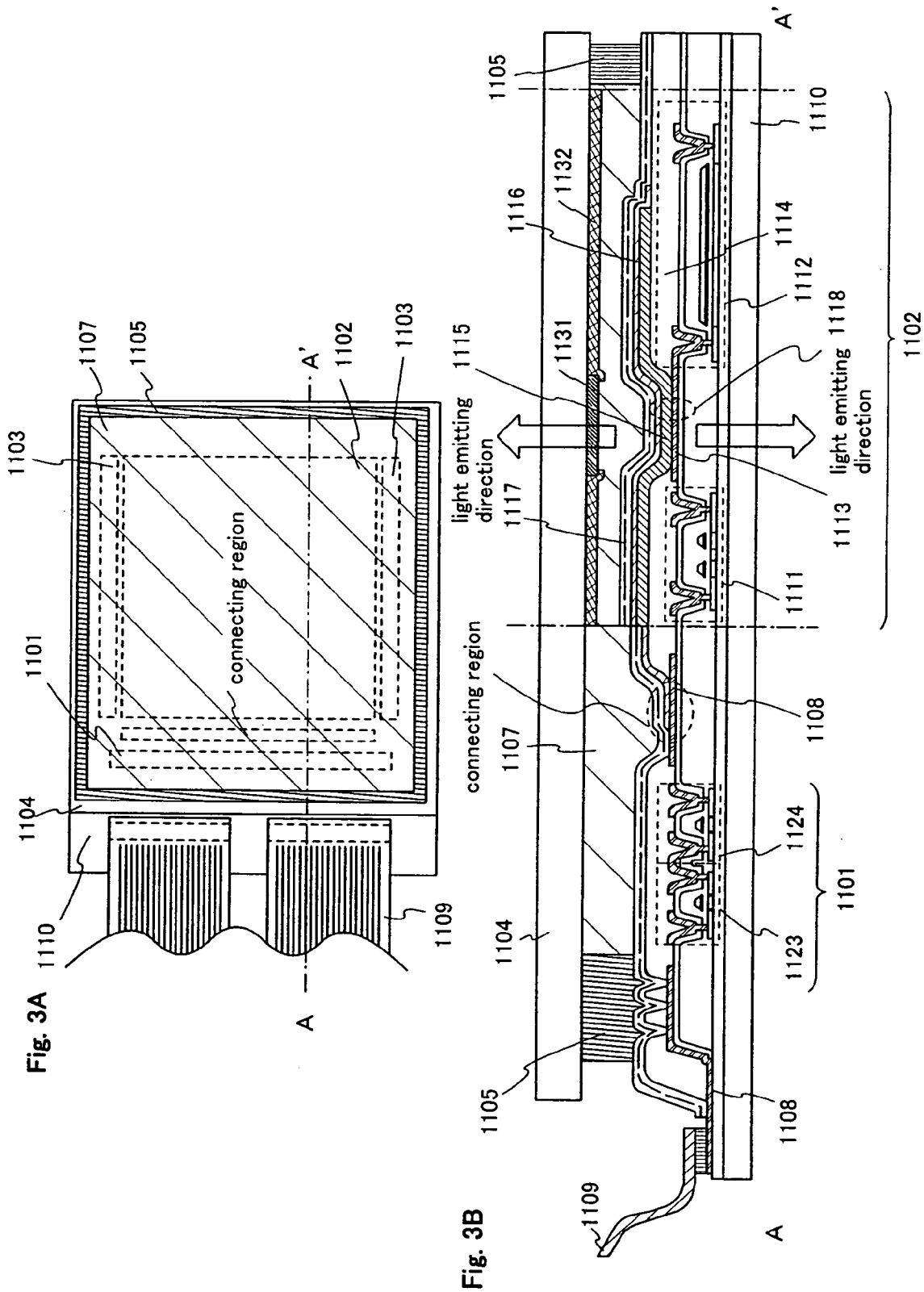
FIG. 3A is a top view and FIG. 3B is a cross sectional view showing a structure of an active matrix type EL display device (Embodiment 1)

In Embodiment 1, shown is an example of manufacturing a light emitting device (having a dual-sided light emitting constitution) provided over a substrate having an insulating surface with a light emitting element in which an organic compound layer is allowed to be a light emitting layer with reference to FIGS. 3A and 3B.

FIG. 3A is a top view showing the light emitting device and FIG. 3B is a cross sectional view of FIG. 3A taken along a line A–A'. Reference numeral 1101 indicated by a dotted line designates a source signal line driving circuit, reference numeral 1102 designates a pixel portion, and reference numeral 1103 designates a gate signal line driving circuit.

Further, reference numeral 1104 designates a transparent sealing substrate, reference numeral 1105 designates a first sealing material, and an interior surrounded by the first sealing material 1105 is filled with a transparent second sealing material 1107. The first sealing material 1105 contains a gap material for securing a space between substrates.

Reference numeral 1108 denotes a wiring for transmitting signals to be inputted to the source signal line driving circuit 1101 and the gate signal line driving circuit 1103. The wiring 1108 receives a video signal or a clock signal from a flexible printed circuit (FPC) 1109 which is an external input terminal. Although only the FPC 1109 is illustrated in the drawing, a printed wiring board (PWB) may be attached.

Subsequently, a sectional constitution will be described with reference to FIG. 3B. Although a driver circuit and a pixel portion are formed over a transparent substrate 1110, the source signal line driving circuit 1101 and the pixel portion 1102 are shown as the driver circuit in FIG. 3B.

In the source signal line driving circuit 1101, a CMOS circuit in which an n-channel type TFT 1123 and a p-channel type TFT 1124 are combined is formed. The TFT which constitutes the driver circuit may be formed by at least one circuit selected from the group consisting of: a CMOS circuit, a PMOS circuit and an NMOS circuit which are publicly known in the art. In Embodiment 1, a driver-integrated type in which the driver circuit is formed over the substrate is shown, however, the driver-integrated type may not necessarily be adopted. The driver circuit can also be formed outside the substrate instead of being formed over the substrate. A constitution of the TFT using a polysilicon film or an amorphous silicon film as an active layer is not particularly limited thereto, either a top gate type TFT or a bottom gate type TFT is permissible.

The pixel portion 1102 is formed by a plurality of pixels each of which includes a switching TFT 1111, a current-controlling TFT 1112 and the first electrode (anode) 1113 which is electrically connected to the drain of the current-controlling TFT 1112. The current-controlling TFT 1112 may either be an n-channel type TFT or a p-channel type TFT, but when it is to be connected to the anode, it is preferably the p-channel type TFT. It is also preferable that a storage capacitor (not shown) is appropriately provided. An example in which only a cross-sectional constitution of one pixel is shown where two TFTs are used in the pixel is illustrated, but three or more TFTs may appropriately be used per pixel.

Since the first electrode 1113 is directly connected to the drain of the TFT 1112, it is preferable that a lower layer of the first electrode 1113 is allowed to be a material layer which can have an ohmic contact with the drain containing silicon, while an uppermost layer thereof which contacts a layer containing an organic compound is allowed to be a material layer which has a large work function. For example, a transparent conductive film (ITO (indium tin oxide alloy), indium oxide zinc oxide alloy ($In_2O_3$—ZnO), zinc oxide (ZnO) or the like) may be used An insulator 1114 (referred to as a bank, a partition wall, a barrier, an embankment and the like) is formed over each end of the first electrode (anode) 1113. The insulator 1114 may be formed by either an organic resin film or an insulating film containing silicon. In the present embodiment, as for the insulator 1114, an insulator is formed in a shape as shown in FIG. 3B by using a positive type photosensitive acrylic resin film.

For the purpose of enhancing a coverage effect, a curved surface having a curvature is to be formed in an upper end portion or a lower end portion of the insulator 1114. For example, when the positive type photosensitive acrylic resin is used as a material for the insulator 1114, it is preferable that a curved surface having a curvature radius (0.2 μm to 3 μm) is provided only to the upper end portion of the insulator 1114. As for the insulator 1114, either one of a negative type which becomes insoluble to an etchant by light, and a positive type which becomes soluble to the etchant by the light can be used.

Further, the insulator 1114 may be covered by a protective film formed of a thin film containing at least one film selected from an aluminum nitride film, an aluminum oxynitride film, a thin film containing carbon as its main component or a silicon nitride film.

A layer 1115 containing an organic compound is selectively formed over the first electrode (anode) 1113 by vapor deposition. In Embodiment 1, the layer 1115 containing the organic compound is formed by the manufacturing apparatus as described in Embodiment Mode 2 so as to have a uniform film thickness. Further, the second electrode (cathode) 1116 is formed over the layer 1115 containing the organic compound. As for the cathode, a material having a small work function (for example Al, Ag, Li, Ca, alloys of thereof, that is, MgAg, MgIn, AlLi, inorganic materials such as $CaF_2$, or CaN) may be used. In Embodiment 1, in order to allow luminescence to pass through the cathode, as for the second electrode (cathode) 1116, a laminate of a thin metal film which is thin in thickness (MgAg: film thickness of 10 nm), and a transparent conductive film with a film thickness of 110 nm (indium tin oxide alloy (ITO)), an indium oxide-zinc oxide alloy ($In_2O_3$—ZnO), or zinc oxide (ZnO)) is used. Then, a light emitting element 1118 including the first electrode (anode) 1113, the layer 1115 containing the organic compound, and the second electrode (cathode) 1116 is fabricated. In the present embodiment, the layer 1115 containing the organic compound is formed by sequentially laminating CuPc (film thickness of 20 nm), α-NPD (film thickness of 30 nm), CBP (film thickness of 30 nm) including an organic metal complex that contains platinum as its central metal (Pt(ppy)acac), BCP (film thickness of 20 nm), and BCP:Li (film thickness of 40 nm), thereby realizing white color light emission. In the present embodiment, the light emitting element 1118 is allowed to be an example of emitting white light, and therein, a color filter (for the purpose of simplicity, an overcoat layer is not illustrated in the drawings) including a colored layer 1131 and a light shielding layer (BM) is provided.

A transparent protective layer 1117 is formed in order to seal the light emitting element 1118. The transparent protective layer 1117 is formed by laminating a first inorganic insulating film, a stress relaxation film and a second inorganic insulating film. As for each of the first and second inorganic insulating films, at least one film selected from the group consisting of: a silicon nitride film, a silicon oxide film, a silicon oxynitride film (SiNO film (composition ratio: N>O), or SiON film (composition ratio: N<O)), and a thin film containing carbon as its main component (for example, DLC film, or CN film) which are obtained by sputtering or CVD can be used. These inorganic insulating films each have a high blocking effect against moisture, however, as film thickness thereof is increased, a film stress is increased, then, they tend to be partially peeled or totally removed. However, stress can be relaxed and, also, moisture can be absorbed by interposing the stress relaxation film between the first inorganic insulating film and the second inorganic insulating film. Even when a minute hole (pinhole or the like) is formed in the first inorganic insulating film by some reasons, the minute hole can be filled by the stress relaxation film and, further, by providing the second inorganic insulating film thereover, an extremely high blocking effect against moisture or oxygen can be attained. As for materials for the stress relaxation film, a material which has smaller stress than the inorganic insulating films and has a hygroscopic property is preferable. In addition to the above-described properties, a material having a translucency is desirable. Further, as for the stress relaxation film, a material film containing an organic compound such as α-NPD (4,4'-bis[N-(naphthyl)-N-phenyl-amino]biphenyl), BCP (bathocuproin), MTDATA (4,4',4"-tris(N-3-methylphenyl-N-phenyl-amino)triphenylamine, and $Alq_3$ (a tris-8-quinolinolate aluminum complex) may be used. Each material film has a hygroscopic property. When they are thin in thickness, they become nearly transparent. Since MgO, $SrO_2$, and SrO each have a hygroscopic property and translucency, and also, a thin film thereof can be obtained by vapor deposition, any one of these oxides can be used as the stress relaxation film. In the present embodiment, a silicon target is used, a film formed in an atmosphere containing a nitrogen gas and an argon gas, that is, a silicon nitride film having a high blocking effect against impurities such as moisture and an alkali metal is used as the first inorganic insulating film or the second inorganic insulating film, and a thin film of $Alq_3$ formed by vapor deposition is used as the stress relaxation film. Further, in order to allow luminescence to penetrate the transparent protective laminate, it is preferable that an entire film thickness of the transparent protective laminate is formed as thin as possible.

Further, in order to seal the light emitting element 1118, the sealed substrate 1104 is bonded thereto by using the first sealing material 1105 and the second sealing material 1107 in an inert gas atmosphere. As for the first sealing material 1105, it is preferable that an epoxy resin is used. As for the second sealing material 1107, the material is not particularly limited as long as it is a material having translucency, and a UV curing epoxy resin or a thermosetting epoxy resin are typically used. A highly heat resistant UV curing epoxy resin (product name 2500 Clear, manufactured by Electrolite Cooperation) having a refractive index of 1.50, a viscosity of 500 cps, a Shore D hardness of 90, a tensile strength of 3,000 psi, a Tg point of 150° C., a volume resistivity of $1\times10^{15}$ Ω·cm, and a withstand voltage of 450 V/mil is used here. As compared with the case in which the gap between the pair of substrates is a space (inert gas), the overall transmittance can be enhanced by filling the second sealing material 1107 between the pair of substrates. The first sealing material 1105 and the second sealing material 1107 are preferably formed of materials which do not allow to penetrate moisture and oxygen as little as possible.

Further, in the present embodiment, a plastic substrate comprising at least one member consisting of: fiberglass-reinforced plastics (FRP), polyvinylfluoride (PVF), Mylar, polyester, an acrylic resin, and the like, other than a glass substrate or a quartz substrate can be used as a material which constitutes the sealing substrate 1104. After the sealing substrate 1104 is bonded by using the first sealing material 1105 and the second sealing material 1107, it is possible to perform sealing by using the third sealing material such that a side surface (exposed face) is covered.

By sealing the light emitting element in the first sealing material 1105 and the second sealing material 1107 as described above, the light emitting element can completely be shielded from outside. In consequence, substance, such as moisture and oxygen, which will deteriorate the organic compound layer, can be prevented from penetrating from the outside. As result, a light emitting device having high reliability can be obtained.

Further, this embodiment can be freely combined with Embodiment Mode 1.

[Embodiment 2]

In Embodiment 2, an example of an electronic equipment provided with two or more display devices will be described with reference to FIGS. 4A to 4F. An electronic equipment equipped with an EL module can be completed by implementing the present invention. The following are examples of electronic equipment: video cameras, digital cameras, goggle type displays (head mounted displays), navigation systems, audio reproducing apparatuses (car audios, audio components, etc.), laptop computers, game machines, portable information terminals (mobile computers, cellular phones, portable game machines, electronic books, etc.), image reproducing apparatuses equipped with a recording medium (specifically, devices equipped with displays each of which is capable of playing a recording medium such as a digital versatile disk (DVD), and displaying the image thereof), and the like.

Figure 4A:
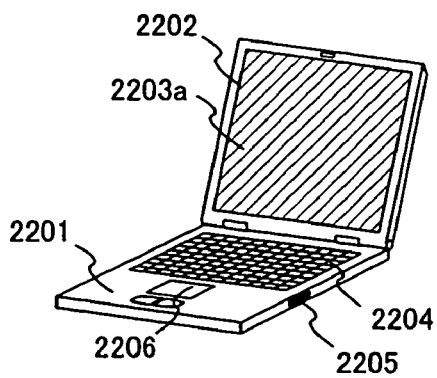
FIGS. 4A to 4G are diagrams showing examples of electronic equipments (Embodiment 2)
Figure 4B:
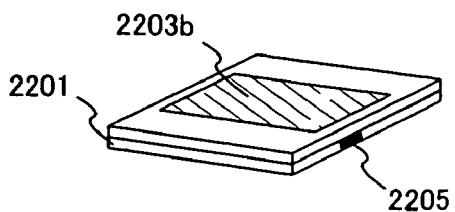

FIG. 4A is a perspective view showing a laptop computer, and FIG. 4B is also a perspective view showing a folded laptop computer. Each lap top computer comprises a main body 2201, a casing 2202, display portions 2203a and 2203b, a keyboard 2204, an external connection port 2205, a pointing mouse 2206, etc.

The laptop computers as illustrated in FIGS. 4A and 4B are equipped with the display portion 2203a that mainly displays full color image and the display portion 2203b that mainly displays characters and symbols in monochrome.

Figure 4C:
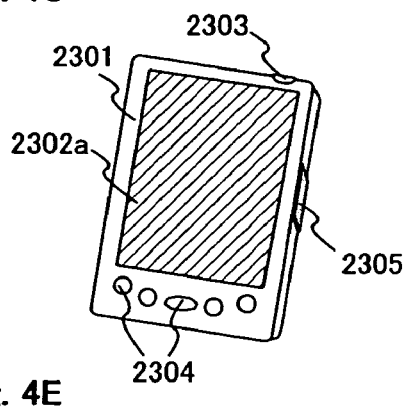
Figure 4D:
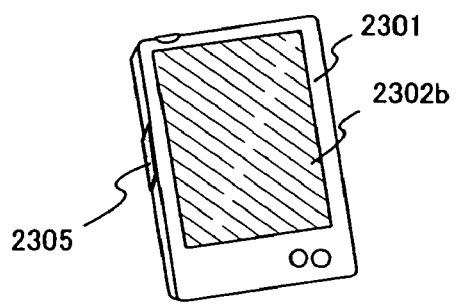

FIG. 4C is a perspective view showing a mobile computer, which comprises a main body 2301, display portions 2302a and 2302b, switches 2303, operation keys 2304, an infrared port 2305, etc. The mobile computer includes the display portion 2302a that mainly displays full color image and the display portion 2302b that mainly displays characters and symbols in monochrome.

Figure 4E:
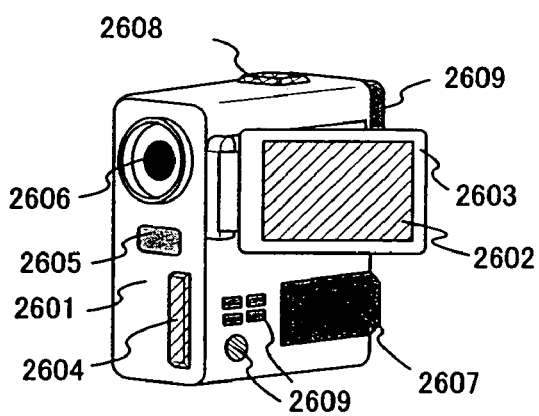

FIG. 4E shows a video camera, which comprises a main body 2601, a display portion 2602, a casing 2603, an external connection port 2604, a remote-controlled receiving portion 2605, an image receiving portion 2606, a battery 2607, an audio input portion 2608, operation keys 2609, etc. The display portion 2602 is a dual-sided emission panel in which one of the screen can mainly display high-definition full color image and another screen can mainly display characters and symbols in monochrome. The display portions 2602 can rotate at an attachment portion. The present invention can be applied to the display portion 2602.

Figure 4F:
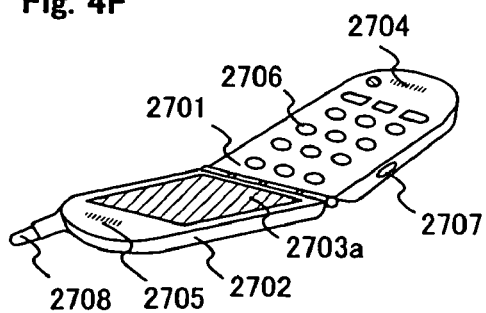
Figure 4G:
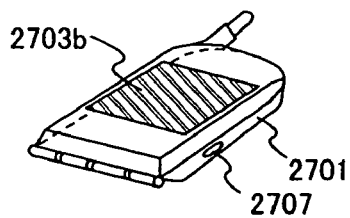

FIG. 4F is a perspective view showing a cellular phone, and FIG. 4G is also a perspective view showing a folded cellular phone. Each cellular phone comprises a main body 2701, a casing 2702, display portions 2703a and 2703b, an audio input portion 2704, an audio output portion 2705, operation keys 2706, an external connection port 2707, an antenna 2708, etc.

The cellular phones as depicted in FIGS. 4F and 4G include the display portions 2703a that mainly display high-definition full color image and the display portions 2703b that mainly display characters and symbols by an area color mode. In this case, a color filter is used for the display portion 2703a, whereas an optical film that becomes an area color is used for the display portion 2703b.

Further, this embodiment can be freely combined with Embodiment Modes and Embodiment 1.

[Embodiment 3]

Figure 6:
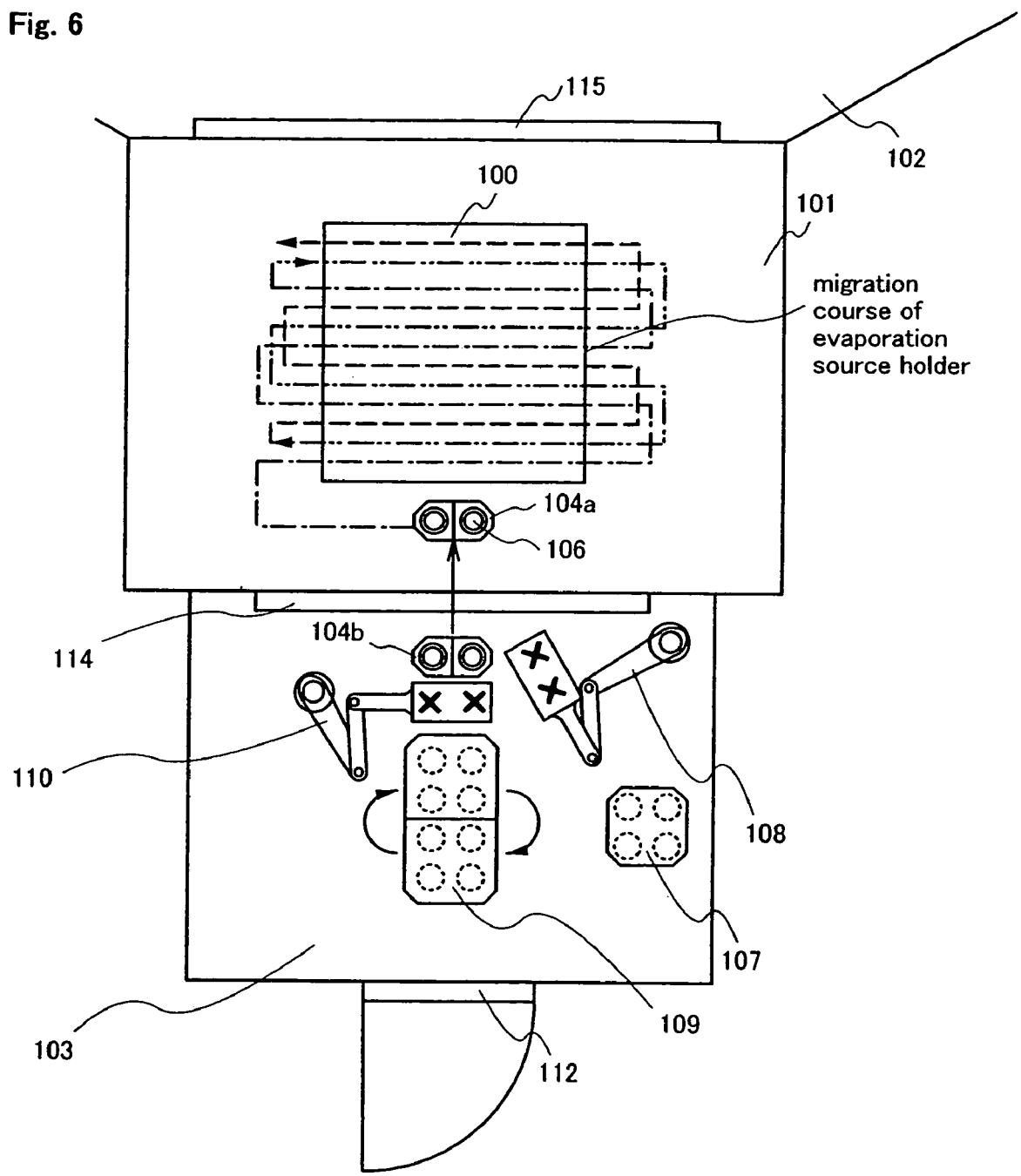
FIG. 6 is a top view of an evaporation device (Embodiment 3)

An example of a top view of an evaporation device will be illustrated in FIG. 6.

In FIG. 6, a film formation chamber 101 includes a substrate holder (not illustrated), a first evaporation source holder 104a and a second evaporation source holder 104b installed with evaporation shutters (not illustrated), a means for moving the evaporation source holders (not illustrated) and a means for producing a low pressure atmosphere (i.e., a vacuum exhaust means). Further, the film formation chamber 101 is vacuum-exhausted to a vacuum degree of not more than $5 \times 10^{-3}$ Torr (0.665 Pa), preferably, $10^{-4}$ through $10^{-6}$ Pa by use of the means for producing the low pressure atmosphere.

Further, the film formation chamber 101 is connected to a gas introduction system for introducing a material gas to several sccm in vapor deposition (not illustrated) and an inert gas (such as Ar, and $N_2$) introduction system for restoring a normal pressure in the film formation chamber (not illustrated). In addition, a cleaning gas (a gas which is one element or a plural elements selected from a group consisting of $H_2$, $F_2$, $NF_3$, and $O_2$) introduction system may be formed. It is preferable that each introduction system is formed so as not to allow the material gas to flow from a gas introduction port into a gas evacuation port by the most direct way.

It is possible that the material gas is intentionally introduced during vapor deposition, and the organic compound film is saturated with the component of the material gas so as to form a high density film, thereby blocking impurities such as oxygen and moisture, which cause deterioration of the film, from intruding and diffusing. As the material gas, more specifically, one kind or a plural kinds selected from a silane group gas (such as monosilane, disilane and trisilane), $SiF_4$, $GeH_4$, $GeF_4$, $SnH_4$ and hydrocarbon group gas (such as $CH_4$, $C_2H_2$, $C_2H_4$ and $C_6H_6$) may be used. Note that a mixed gas in which aforementioned gases are diluted by hydrogen, argon and the like may also used as the material gas. Before the gas is introduced inside the device, the gas is highly purified by a gas purifier. Accordingly, it is necessary to provide the gas purifier so that after the gas is highly purified, the gas is introduced into the evaporation device. A residual gas (such as oxygen, moisture and other impurities) contained in the gas can be previously removed. Therefore, it is possible to prevent these impurities from being introduced inside the device.

When the light emitting element has defect portions such as pin holes and short circuits after the light emitting element containing Si is completely formed, a monosilane gas is introduced in vapor deposition such that Si reacts and forms an insulator such as SiOx and SiCx due to heat generation in the defect portions, which reduces leakage in the pin holes and the short circuits. As result, point defects (dark spots etc.) are not expanded, and, hence, a self-healing effect can be obtained.

When above-mentioned material gas is introduced, in addition to the cryopump, it is preferable to use a turbo molecular pump or a dry pump.

In the film formation chamber 101, the evaporation source holder 104 can move along a migration course as depicted by a chained line in FIG. 6 at multiple times. FIG. 6 shows only one example of the migration course of the evaporation source holder, and it is not limited to the example. In order to improve the uniformity of the film thickness, the vapor deposition is preferably carried out by shifting the migration course so as to move the evaporation source holder 104 as illustrated in FIG. 6. Further, the evaporation source holder may also be moved back and forth along an identical migration course. Furthermore, it is possible to uniformize the film thickness by arbitrarily changing the migration rate of the evaporation source holder in each migration course zone such that time for the film formation is reduced. For instance, the evaporation source holder may be shifted in the X direction or the Y direction at a rate of 30 cm/min to 300 cm/min.

Figure 9:
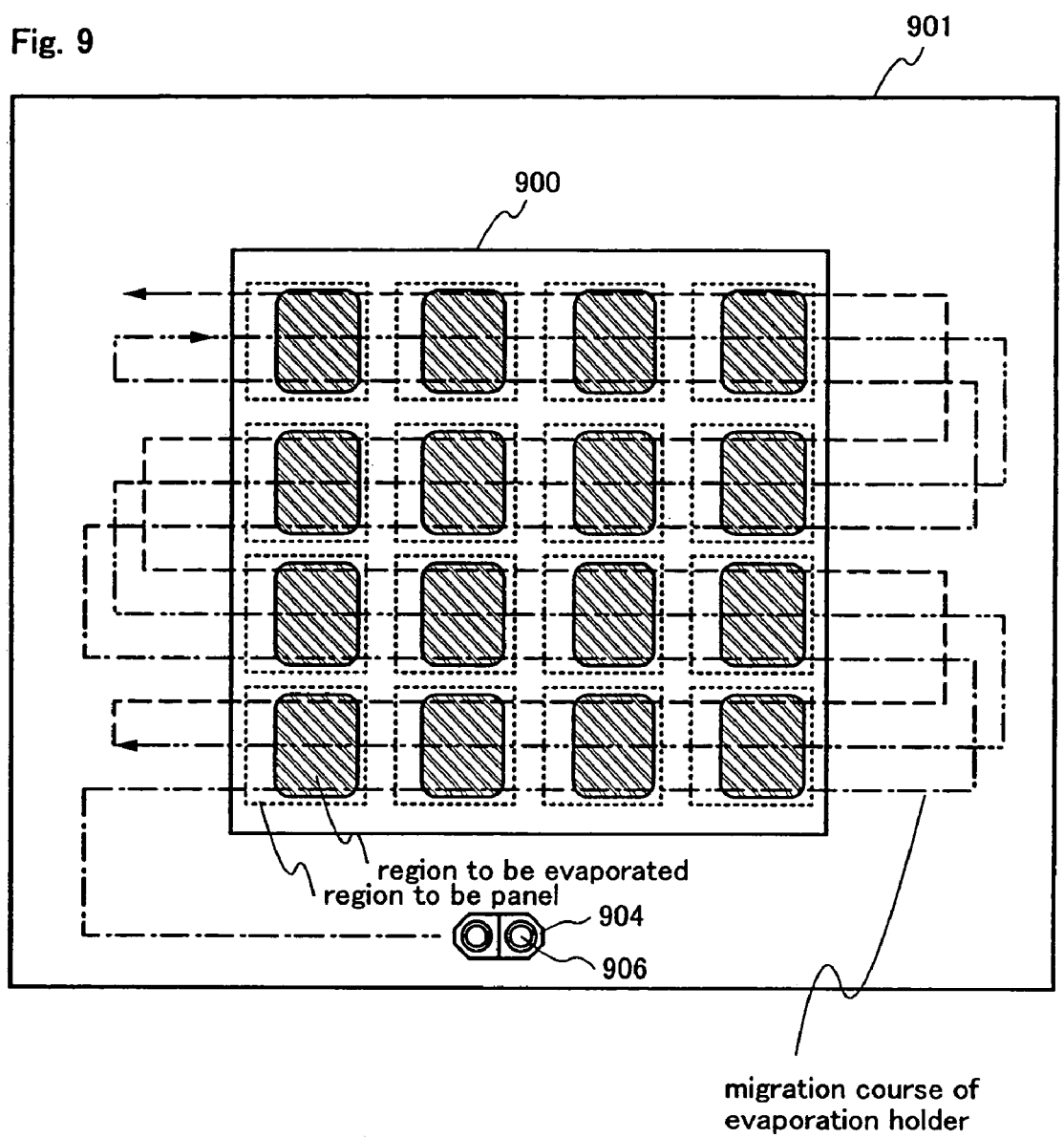
FIG. 9 is a top view of an interior of a film formation chamber (Embodiment 3)

When the white color light emitting element is manufactured, it is possible to perform vapor deposition locally as illustrated in FIG. 9. The vapor deposition is locally carried out so as to include at least the regions to be display regions within the regions to be panels. By performing vapor deposition locally, it is possible to prevent regions that are unnecessary to be evaporated from being evaporated. In order to evaporate locally on the regions to be display regions, shutters (not illustrated) are used. Vapor deposition is performed by arbitrarily opening or closing the shutters without using masks. FIG. 9 is an example of a case of mass production, and reference numeral 900 denotes a large size substrate, reference numeral 901 denotes a film formation chamber, reference numeral 904 denotes a movable evaporation source holder, and reference numeral 906 denotes a crucible.

Containers (crucibles 106) encapsulated with an evaporation material are set in the evaporation source holders 104a and 104b. This embodiment shows an example in which each evaporation source holder 104a and 104b includes two crucibles, respectively. In the installation chamber 103, a film thickness meter (not illustrated) is provided. In this embodiment, during the migration of the evaporation source, the film thickness is not monitored by the film thickness meter so as to reduce exchange frequency of the film thickness meter.

When a plurality of containers (such as crucibles that accommodate an organic compound, and evaporation boats) are equipped in one evaporation source holder, it is preferable to set the mounting angle of the crucibles obliquely such that the evaporation directions (i.e., evaporation center) intersect at a position of a substance that is evaporated in order to mix each organic compound.

The evaporation source holder always stands in a crucible installation chamber, and heats and maintains temperature until the evaporation rate becomes stable. The film thickness meter (not illustrated) is installed in the crucible installation chamber. When the evaporation rate becomes stable, the substrate is transported into the film formation chamber 102, and after masking (not illustrated) and aligning is carried out, the shutter is opened to transfer the evaporation source holder. Note that the alignment of the evaporation mask and the substrate is preferably confirmed by using a CCD camera (not illustrated). Alignment markers may be provided in the substrate and the evaporation mask so as to perform the alignment control thereof. When vapor deposition is finished, the evaporation source holder is transferred into the crucible installation chamber, and then the shutter is closed. When the shutter is closed completely, the resultant substrate is transported into the transporting chamber 102.

In FIG. 6, a plurality of evaporation source holders can stand in the installation chamber 103. Therefore, when a material in one evaporation source holder is run out, the evaporation source holder is replaced with another one evaporation source holder and sequentially changed the evaporation source holders, permitting film formation in succession. In addition, it is possible to replenish an EL material in the empty evaporation source holder while other evaporation source holder is transported in the film formation chamber. The film formation can be efficiently carried out by using the plurality of evaporation source holders 104.

In FIG. 6, the evaporation source holders 104a and 104b accommodate only tow crucibles. However, it is also possible to use a evaporation source holder which can accommodate four crucibles, although only one crucible or two crucibles are set in the crucibles.

According to the present invention, time for forming films can be reduced. Conventionally, in case of replenishing the EL material in the empty evaporation source holder, after the film formation chamber has been exposed to the atmospheric air and the EL material has been replenished in the crucible, the interior of the film formation chamber has been necessary to be vacuum-exhausted. Therefore, the time required for replenishing the EL material has been prolonged, causing deterioration in through put.

If the EL material is hardly adhered to an inner wall of the film formation chamber, the frequency of maintenance such as cleaning in the inner wall of the film formation chamber can be lessened.

Setting of the crucible 106 in the evaporation source holders 104a and 104b is also carried out in the installation chamber 103b. FIGS. 7A to 7C show the condition of transporting the crucible 106. In FIGS. 7A to 7C, same reference numerals are used for corresponding portions in FIG. 6. The crucible 106 which is sealed with vacuum in a container consisted of an upper part 721a and a lower part 721b is transported through a door 112 of an installation chamber 103. At first, the transported container is placed on the turntable for installing a container 109 in a state where the fastener 702 is unclasped in the installation chamber. Since the inside of the installation chamber is under vacuum, the container is as it is when the fastener 702 is unclasped (see FIG. 7A). Subsequently, an interior of the installation chamber 103a is vacuum-exhausted so as to uncouple a cover (i.e., the upper part 721a) from the lower part 721b.

The condition of transporting the container will be described in more detail with reference to FIG. 7A. A second container has two portions of an upper psrt (721a) used for transporting and a lower part (721b) and comprises fixing means 706 for fixing a first container (crucible) provided in the upper part of the second container; a spring 705 for applying pressure to the fixing means; a gas introduction port 708 at the lower part of the second container, which serves as a gas pathway for maintaining a reduced pressure in the second container; an O-ring that fixes the upper portion container 721a and the lower portion container 721b; and a fastener 702. A first container 106, in which a purified evaporation material is filled, is set in the second container. In addition, the second container is preferable to be made of a material containing stainless, and the first container 106 is preferable to be made of a material containing titanium.

A purified evaporation material is filled in the first container 106 at the material manufacturer. The second upper part 721a and the second lower part 721b are bonded to each other using the O-ring and fixed using the fastener 702. The first container 106 is hermetically sealed in the second container, then, the second container is reduced pressure and substituted for a nitrogen atmosphere through the gas introduction port 708, and then, the first container 106 is fixed by adjusting the spring 705 with the fixing means 706. In addition, a desiccant can be put into the second container. Consequently, maintaining a vacuum, low pressure, or nitride atmosphere in the second container can prevent even trace amount of oxygen or moisture from adhering to the evaporation material.

The cover of the container is lifted by means of a robot for transporting a cover 108 so as to be put on a cover installation table 107. Note that the transporting means of the present invention is not limited to the structure as described in FIGS. 7B and 7C, in which the first container 106 is sandwiched (picked up) from above the first container. Structures in which sides of the first container are sandwiched by the robot for transporting a cover 108 so as to transport the first container 106 may also be employed.

After rotating the turntable for installing the container 109, only the crucible is lifted by the crucible-transporting robot 110 while leaving the lower part of the container on the turntable 109. Finally, the crucible is set in the evaporation source holders 104a and 104b, which are standing in the installation chamber 103 (see FIG. 7C).

Further, a cleaning gas (one gas, or a plurality of gasses selected from the group consisting of $H_2$, $F_2$, $NF_3$, and $O_2$) introduction system may be provided in the installation chamber 103 so as to clean components such as the evaporation source holder and the shutter. It is also possible that plasma is generated by providing a plasma generating means in the installation chamber, or a gas that is ionized by plasma is introduced in the installation chamber such that components such as the inner wall of the installation chamber, the evaporation source holder, and the shutter are cleaned, and the interior of the installation chamber is vacuum-exhausted by use of the vacuum exhaust means. Plasma for cleaning the aforementioned components may be generated by exciting one gas, or a plurality of gasses selected from the group consisting of Ar, $N_2$, $H_2$, $F_2$, $NF_3$, and $O_2$.

The film formation chamber can be kept clean by transporting the evaporation source holders 104a and 104b into the installation chamber 103 and cleaning in the installation chamber 103.

Further, this embodiment can be freely combined with Embodiment Mode 2. Note that the evaporation device as depicted in FIG. 6 may be arranged in any one of the film formation chambers 506W1, 506W2, and 506W3, whereas the installation chamber as depicted in FIGS. 7A and 7B may be arranged in any one of the installation chambers 526a to 526n as depicted in FIG. 5.

[Embodiment 4]

Embodiment 4 will show an example of a film formation chamber in which an interior of a film formation chamber and an evaporation mask can be cleaned without being exposed to the atmospheric air. FIG. 8 is a cross sectional view sowing the film formation chamber of Embodiment 4.

As illustrated in FIG. 8, an example of generating a plasma 1301 between an evaporation mask 1302a and an electrode 1302b, which are connected to each other via a high frequency power source 1300a and a capacitor 1300b, will be described.

In FIG. 8, the evaporation mask 1302a that is fixed in a holder is provided in contact with a portion in which a substrate is formed (i.e., a portion surrounded by a doted line). An evaporation source holder 1322 that can heat at different temperatures is formed underneath the evaporation mask 1302a. The evaporation source holder 1322 can be moved in a X direction, a Y direction, a Z direction, or a θ direction, which is identical with a rotation direction.

The organic compound in the film formation chamber is heated up to a sublimation temperature by heating means provided in the evaporation source holder (typically, by resistive heating), and, hence, the organic compound is vaporized and evaporated to a surface of the substrate. When vapor deposition is carried out, a substrate shutter 1320 is moved to a position where the substrate shutter does not block the vapor deposition. Since the evaporation source holder is equipped with a shutter that move along the evaporation source holder, the shutter 1321 is also moved to a position where the shutter 1321 does not block the vapor deposition, when the vapor deposition is carried out.

In vapor deposition, a gas introduction system, which enables to flow a trace amount of a gas formed of a smaller particle than a particle of an organic compound material, i.e., a material having a smaller atomic radius so as to soak the organic compound film with the material having a smaller atomic radius is provided. More specifically, one or a plurality of types of gases selected from the group consisting of a silane group gas (such as monosilane, disilane, and trisilane), $SiF_4$, $GeH_4$, $GeF_4$, $SnH_4$, and a hydrocarbon group gas (such as $CH_4$, $C_2H_2$, $C_2H_4$, and $C_6H_6$) may be used as the material gas having a smaller atomic radius. A mixed gas in which aforementioned gases are diluted by hydrogen or argon may also be used as the material gas having a smaller atomic radius. For these gases introduced into the device, gases highly purified by a gas purifier prior to the introduction into the device are used. Therefore, it is required that a gas purifier is implemented so that the gas is introduced into the evaporation device following the high purification of the gas. Since by utilizing this, remnant gas (such as oxygen, moisture and the other impurities) contained in the gas can be previously removed, which prevents the impurities from being introduced into the interior of the device.

For instance, if the light emitting element has defect portions such as pin holes and short circuits after the light emitting element is completely formed by adding Si, the defect portions is heated by introducing monosilane gas in vapor deposition such that Si reacts and forms an insulator such as SiOx and SiCx, which reduces leakage in the pin holes and the short circuits. Therefore, point defects (dark spots etc.) are not expanded, and hence, a self-healing effect can be obtained.

The components of the material gas introduced by heating substrate can be efficiently deposited by using a heating means such as a heater 1304 for heating a substrate.

Further, a radical may be generated by a plasma generating means. For instance, in case of using monosilane, a silicon oxide precursor such as SiHx, SiHxOy and SiOy is generated by the plasma generating means such that the generated silicon oxide precursor is deposited over the substrate along with the organic compound material from the evaporation source. Monosilane easily reacts to oxygen, moisture and the like, and therefore can reduce a oxygen content or a moisture content in the film formation chamber.

Moreover, in order to introduce plural kinds of gases in the film formation chamber, the vacuum exhaust processing chamber is equipped with a magnetic levitated type turbo molecular pump 1326 and cryopump 1327. By utilizing these pumps, an ultimate vacuum degree in the transport chamber is allowed to be in the range of from $10^{-5}$ Pa to $10^{-6}$ Pa. After the vacuum exhaust is carried out by use of the cryopump 1327, the cryopump 1327 is stopped, and the vacuum exhaust is further performed by use of the turbo molecular pump 1326 while vapor deposition is carried out by flowing several sccm of the material gas. It is also possible that the material gas is ionized in the film formation chamber and is adhered to the evaporated organic material so as to carry out vapor deposition by the ion plating method.

After the termination of vapor deposition, the substrate is taken out, and then cleaning for removing the evaporation materials adhered to a fixture provided in the film formation chamber and the inner wall of the film formation chamber is performed without being exposed to the atmospheric air.

The cleaning is preferably carried out by transforming the evaporation source holder 1322 into the installation chamber (not illustrated here).

In the cleaning, the wiring electrode 1302b is transported into the position opposite to the evaporation mask 1302a. Further, the gas is introduced into the film formation chamber 1303. The gas to be introduced into the film formation chamber 1303 may be one or a plurality of types of gases selected from the group consisting of Ar, $H_2$, $F_2$, $NF_3$, and $O_2$. Next, a high frequency electric field is applied to the evaporation mask 1302a from the high frequency power source 1300a to excite the gas (Ar, H, F, $NF_3$, or O) and generate plasma 1301. In such a manner, plasma 1301 is generated in the film formation chamber 1303 and the evaporation substances adhering to the inner wall of the film formation chamber, the deposition preventing shield 1305, and the deposition mask 1302a are evaporated and exhausted outside of the film formation chamber. By the film formation apparatus shown in FIG. 4, cleaning can be carried out at the time of maintenance without exposing the interior of the film formation chamber and the evaporation mask to the atmospheric air.

In this case, although the example in which plasma is generated between the evaporation mask 1302a and the electrode 1302b interposed between the evaporation mask 1302a and the evaporation source holder 1306 is exemplified, the invention is not limited to that but include any as long as it comprises a plasma generating means. Further, a high frequency power source may be connected to the wiring electrode 1302b. Further, a plate electrode, a mesh electrode or an electrode just like a shower head into which a gas can be introduced can be substitute for the wiring electrode 1302b. Note that, as the plasma generating method, ECR, ICP, helicon, magnetron, second frequency, triode, LEP, and the like can be arbitrarily utilized.

Further, the above-mentioned cleaning by means of plasma may be carried out every film formation process and also may be carried out after the completion of multiple film formation processes.

This embodiment can be freely combined with Embodiment Mode 2 and Embodiment 3.

[Embodiment 5]

In Embodiment 5, element characteristics of an organic light emitting element (including a element constitution of: ITO/Cu-Pc (20 nm)/α-NPD (30 nm)/CBP+Pt(ppy)acac: 15 wt % (20 nm)/BCP (30 nm)/CaF (2 nm)/Al (100 nm)) will be described. An emission spectrum of the organic light emitting element having aforementioned constitution is depicted as a spectrum 1 in FIG. 10 and FIG. 11.

Figure 10:
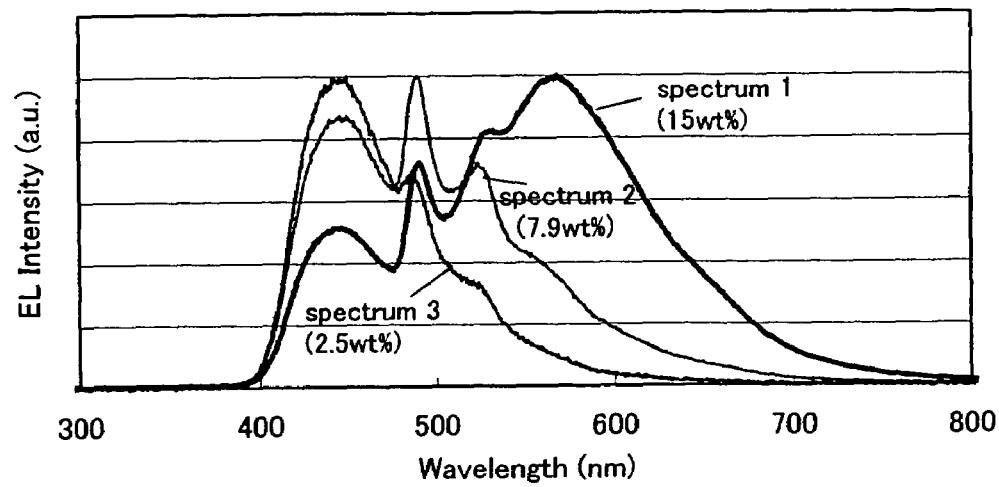
FIG. 10 is a diagram showing radiation spectrum (Embodiment 5)

A spectrum in FIG. 10 denotes an emission spectrum in case of flowing 1 mA of electric current in the organic light emitting element having aforementioned constitution (at a luminance of about 960 cd/m$^2$). According to the results as shown in the spectrum 1, it is confirmed that white color light emission including following three components can be obtained: blue color light emission (approximately 450 nm) of α-NPD contained in the first light emitting layer; green color phosphorescence (approximately 490 nm) of Pt(ppy)acac contained in the second light emitting layer; and orange color excimer emission (approximately 570 nm) of Pt(ppy) acac contained in the second light emitting layer. A CIE chromaticity coordinates of white color light emission are (x, y)=(0.346, 0.397). The luminance is almost white color, visually.

By measuring the ionization potentials of α-NPD used for the first light emitting layer and CBP used for a host material of the second light emitting layer, the ionized potential of α-NPD was approximately 5.3 eV, and that of CBP was approximately 5.9 eV. The difference between ionization potentials of α-NPD and CBP was approximately 0.6 eV, and this value meets the preferable condition of not less than 0.4 eV according to the present invention, which is supposed to result in a favorable white color light emission. Note that the ionization potentials are measured by using a photoelectron spectroscopy apparatus #AC-2 (manufactured by Riken Keiki Co., Ltd.).

Figure 11:
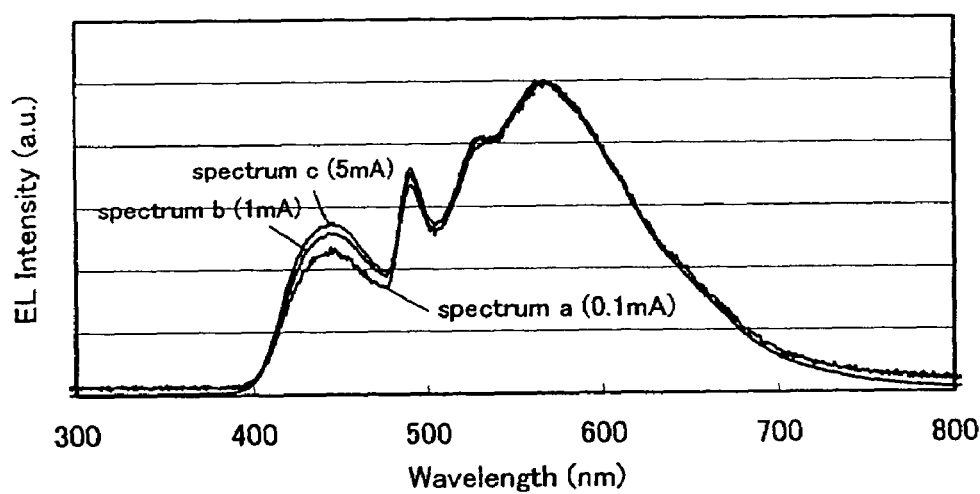
FIG. 11 is a diagram showing a dependency of a radiation spectrum on an electric current density (Embodiment 5).

FIG. 11 is a graph showing measured spectrums by changed values of electric current flowing in the organic light emitting element having aforementioned constitution. The measurement results in case of changing the electric current value according to "spectrum a" (0.1 mA), "spectrum b" (1 mA) and "spectrum c" (5 mA) are depicted in FIG. 11. As apparent from the results, if the electric current is increased (or if luminance is increased), the shape of spectrum is hardly changed. Accordingly, it is known that the organic light emitting element of the present embodiment exhibits stable white color light emission that is not adversely affected by the change of the electric current value. In FIG. 11, light emission intensity of the whole spectra are normalized according to each light intensity of a specific wavelength.

As electric characteristics of the organic light emitting element having aforementioned constitution, a luminance of approximately 460 cd/m$^2$ was obtained in case of setting the electric current density to 10 mA/cm$^2$.

COMPARATIVE EXAMPLE 1

As compared with the case of Embodiment 5, emission spectra of the organic light emitting elements, which are formed at concentrations of Pt(ppy)acac different from that of Embodiment 5 will be depicted as a spectrum 2 and spectrum 3 in FIG. 10. The spectrum 2 denotes the measurement result when the concentration of Pt(ppy)acac is 7.9 wt %, whereas the spectrum 3 denotes the measurement result when the concentration of Pt(ppy)acac is 2.5 wt %. In each case, 1 mA electric current flows in each spectrum.

As shown in the spectrum 3, when the concentration of Pt(ppy)acac is 2.5 wt %, only blue color light emission (approximately 450 nm) of α-NPD that forms the first light emitting layer and green color light emission (approximately 490 nm and 530 nm) of Pt(ppy)acac contained in the second light emitting layer are observed. As result, white color light emission is not obtained. Meanwhile, as shown in the spectrum 2, when the concentration of Pt(ppy)acac is 7.5 wt %, excimer light emission of Pt(ppy)acac is slightly added to spectrum in the vicinity of 560 nm as a shoulder. However, the peak intensity is not enough to provide sufficient white color light emission.

This embodiment can be freely combined with Embodiment Mode 1 and Embodiment Mode 2.

According to the present invention, one sheet panel can provide dual-sided emission display in which, for instance, different images can be displayed (in full color display, monochrome display or area color display) on a topside screen and a backside screen.

Furthermore, since the light emitting element emits white color light, a high-precision metal mask for selectively evaporating each region corresponding to R, G, and B is unnecessary, which increasing productivity. In addition, when vapor deposition is selectively carried out for each region corresponding to R, G, and B, a large number of evaporation chambers must be provided for R, G, and B. On the other hand, when the light emitting element emits white color light, the number of the evaporation chambers provided for the manufacturing device can be relatively reduced.

What is claimed is:

1. A light emitting device comprising a pixel portion comprising:
   a light emitting element comprising:
   a first transparent electrode;
   a second transparent electrode; and
   a layer between the first and second transparent electrodes, the layer comprising a first light emitting layer comprising an organic metal complex; and
   a color filter,
   wherein the light emitting element simultaneously generates blue color light, phosphorescence from the organic metal complex, and excimer light emission from the organic metal complex so as to generate white color light emission,
   wherein white color light emission passing through the first transparent electrode generates a full color display by the color filter, and
   wherein white color light emission passing through the second transparent electrode generates a monochrome display.

2. A light emitting device comprising a pixel portion comprising:
   a light emitting element comprising:
   a first transparent electrode;
   a second transparent electrode; and
   a layer between the first and second transparent electrodes, the layer comprising a first light emitting layer comprising an organic metal complex;
   a color filter;
   a first polarizing plate; and
   a second polarizing plate,
   wherein the light emitting element simultaneously generates blue color light, phosphorescence from the organic metal complex, and excimer light emission from the organic metal complex so as to generate white color light emission,
   wherein white color light emission passing through the first transparent electrode generates a full color display by the color filter and the first polarizing plate, and
   wherein white color light emission passing through the second transparent electrode generates a monochrome display by the second polarizing plate.

3. A light emitting device according to claim 1,
   wherein the layer between the first and second transparent electrodes further comprises a second light emitting layer that emits the blue color light;
   wherein the first light emitting layer simultaneously generates a phosphorescence emission and an excimer light emission from the organic metal complex.

4. A light emitting device according to claim 2,
   wherein the layer between the first and second transparent electrodes further comprises a second light emitting layer that emits the blue color light;
   wherein the first light emitting layer simultaneously generates a phosphorescence emission and an excimer light emission from the organic metal complex.

5. A light emitting device according to claim 1,
   wherein the first light emitting layer further comprises a host material, and
   wherein the organic metal complex is mixed with the host material at a concentration of between 10 wt % and 40 wt %.

6. A light emitting device according to claim 2,
   wherein the first light emitting layer further comprises a host material, and
   wherein the organic metal complex is mixed with the host material at a concentration of between 10 wt % and 40 wt %.

7. A light emitting device according to claim 5, wherein the concentration of the organic metal complex is between 12.5 wt % and 20 wt %.

8. A light emitting device according to claim 6, wherein the concentration of the organic metal complex is between 12.5 wt % and 20 wt %.

9. A light emitting device according to claim 3, wherein the layer between the first and second transparent electrodes further comprises an electron transporting layer.

10. A light emitting device according to claim 4, wherein the layer between the first and second transparent electrodes further comprises an electron transporting layer.

11. A light emitting device according to claim 2, wherein a first direction of a first polarizing axis of the first polarizing plate is perpendicular to the second polarizing axis of the second polarizing plate.

12. A light emitting device comprising a pixel portion comprising:
    a light emitting element comprising:
    a first transparent electrode;
    a second transparent electrode; and
    a layer between the first and second transparent electrodes, the layer comprising a first light emitting layer comprising an organic metal complex;
    a first color filter comprising:
    a red color layer;
    a green color layer; and
    a blue color layer;
    a second color filter comprising one of colored layers of red, blue and green,
    wherein the light emitting element simultaneously generates blue color light, phosphorescence from the organic metal complex, and excimer light emission from the organic metal complex so as to generate white color light emission,
    wherein white color light emission passing through the first transparent electrode generates a full color display by the first color filter, and
    wherein white color light emission passing through the second transparent electrode generates a monochrome display by the second color filter.

13. A light emitting device according to claim 1,
    wherein the pixel portion is formed over a substrate,
    wherein the full color light display is generated on a first surface of the substrate, and
    wherein the monochrome display is generated on a second surface of the substrate.

14. A light emitting device according to claim 2,
    wherein the pixel portion is formed over a substrate,
    wherein the full color light display is generated on a first surface of the substrate, and
    wherein the monochrome display is generated on a second surface of the substrate.

15. A light emitting device according to claim 12,
    wherein the pixel portion is formed over a substrate,
    wherein the full color light display is generated on a first surface of the substrate, and
    wherein the monochrome display is generated on a second surface of the substrate.

* * * * *